United States Patent
Péter et al.

(10) Patent No.: US 12,298,663 B2
(45) Date of Patent: May 13, 2025

(54) METHOD OF MANUFACTURING A PELLICLE FOR A LITHOGRAPHIC APPARATUS, A PELLICLE FOR A LITHOGRAPHIC APPARATUS, A LITHOGRAPHIC APPARATUS, A DEVICE MANUFACTURING METHOD, AN APPARATUS FOR PROCESSING A PELLICLE, AND A METHOD FOR PROCESSING A PELLICLE

(71) Applicant: ASML NETHERLANDS B.V., Veldhoven (NL)

(72) Inventors: Mária Péter, Eindhoven (NL); Erik Achilles Abegg, Eindhoven (NL); Adrianus Johannes Maria Giesbers, Vlijmen (NL); Johan Hendrik Klootwijk, Eindhoven (NL); Maxim Aleksandrovich Nasalevich, Eindhoven (NL); Wilhelmus Theodorus Anthonius Johannes Van Den Einden, Deurne (NL); Willem Joan Van Der Zande, Bussum (NL); Pieter-Jan Van Zwol, Eindhoven (NL); Johannes Petrus Martinus Bernardus Vermeulen, Leende (NL); David Ferdinand Vles, Eindhoven (NL); Willem-Pieter Voorthuijzen, 's-Hertogenbosch (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/770,175

(22) PCT Filed: Oct. 11, 2016

(86) PCT No.: PCT/EP2016/074280
§ 371 (c)(1),
(2) Date: Apr. 20, 2018

(87) PCT Pub. No.: WO2017/067813
PCT Pub. Date: Apr. 27, 2017

(65) Prior Publication Data
US 2019/0056654 A1 Feb. 21, 2019

(30) Foreign Application Priority Data

Oct. 22, 2015 (EP) .................................. 15191052
Feb. 22, 2016 (EP) .................................. 16156637

(Continued)

(51) Int. Cl.
G03F 1/62 (2012.01)
G03F 1/38 (2012.01)
G03F 7/00 (2006.01)

(52) U.S. Cl.
CPC ............... *G03F 1/62* (2013.01); *G03F 1/38* (2013.01); *G03F 7/70958* (2013.01); *G03F 7/70983* (2013.01); *G21K 2201/067* (2013.01)

(58) Field of Classification Search
CPC .......... G03F 1/62; G03F 1/38; G03F 7/70983; G03F 7/70958; G03F 2201/067; G03F 1/64

See application file for complete search history.

(56) References Cited

U.S. PATENT DOCUMENTS 6,350,549 B1 * 2/2002 Sakurai ............... G03F 1/62
430/5
7,153,615 B2 12/2006 Bristol et al.
(Continued)

FOREIGN PATENT DOCUMENTS

CN 102736442 10/2012
CN 103080840 5/2013
(Continued)

OTHER PUBLICATIONS

Machine translation of KR 20130088565 (2013).*
(Continued)

*Primary Examiner* — Martin J Angebrannndt
(74) *Attorney, Agent, or Firm* — Pillsbury Winthrop Shaw Pittman, LLP

(57) ABSTRACT

Methods of manufacturing a pellicle for a lithographic apparatus including a method involving depositing at least one graphene layer on a planar surface of a substrate. The substrate has a first substrate portion and a second substrate portion. The method further includes removing the first substrate portion to form a freestanding membrane from the at least one graphene layer. The freestanding membrane is supported by the second substrate portion.

20 Claims, 25 Drawing Sheets

(30) Foreign Application Priority Data

May 19, 2016 (EP) .................................... 16170384
Sep. 1, 2016 (EP) .................................... 16186851

(56) References Cited

U.S. PATENT DOCUMENTS

| | | | |
|---|---|---|---|
| 7,763,394 | B2 | 7/2010 | Stehle |
| 7,767,985 | B2 | 8/2010 | Okoroanyanwu et al. |
| 9,256,123 | B2 | 2/2016 | Shih et al. |
| 9,395,630 | B2 | 7/2016 | Yakunin et al. |
| 9,606,445 | B2 | 3/2017 | Banine et al. |
| 9,703,187 | B2 | 7/2017 | Ono et al. |
| 9,897,930 | B2 | 2/2018 | Sjmaenok et al. |
| 11,467,486 | B2 * | 10/2022 | Kurganova .............. G03F 1/62 |
| 2005/0042153 | A1 | 2/2005 | Bristol et al. |
| 2007/0284557 | A1 | 12/2007 | Gruner et al. |
| 2008/0131795 | A1 * | 6/2008 | Gallagher ................. G03F 1/60 430/5 |
| 2008/0152873 | A1 | 6/2008 | Okoroanyanwu et al. |
| 2009/0246644 | A1 * | 10/2009 | Chakravorty ............. G03F 1/64 430/5 |
| 2009/0274962 | A1 * | 11/2009 | Kubota ................. B82Y 10/00 430/5 |
| 2011/0200787 | A1 * | 8/2011 | Regan ..................... H01J 37/20 428/138 |
| 2011/0249243 | A1 | 10/2011 | Sjmaenok et al. |
| 2011/0311029 | A1 | 12/2011 | Andersson |
| 2012/0223256 | A1 * | 9/2012 | Bykanov ................ H05G 2/005 250/504 R |
| 2012/0281193 | A1 | 11/2012 | Loopstra et al. |
| 2013/0088699 | A1 * | 4/2013 | Yakunin .................. G03F 7/702 355/67 |
| 2013/0098768 | A1 | 4/2013 | Lee et al. |
| 2013/0244023 | A1 | 9/2013 | Kowlgi et al. |
| 2013/0250260 | A1 * | 9/2013 | Singh ........................ G03F 1/62 355/53 |
| 2014/0044240 | A1 | 2/2014 | Pahlke et al. |
| 2014/0065525 | A1 * | 3/2014 | Yamada ..................... G03F 1/22 430/5 |
| 2014/0160455 | A1 | 6/2014 | Yakunin et al. |
| 2014/0319612 | A1 * | 10/2014 | Brawley ............. H01L 27/1203 438/153 |
| 2015/0059449 | A1 | 3/2015 | Xu et al. |
| 2015/0160569 | A1 | 6/2015 | Osorio Oliveros |
| 2015/0168824 | A1 * | 6/2015 | Sun ........................... G03F 1/22 430/5 |
| 2015/0192861 | A1 | 7/2015 | Banine et al. |
| 2015/0309404 | A1 | 10/2015 | Lin et al. |
| 2015/0309405 | A1 | 10/2015 | Shih et al. |
| 2016/0201201 | A1 * | 7/2016 | Kim ........................... C23F 1/00 216/99 |
| 2016/0282712 | A1 | 9/2016 | Kim et al. |
| 2016/0313637 | A1 | 10/2016 | Jansen et al. |
| 2017/0038675 | A1 | 2/2017 | Ahn et al. |
| 2017/0090278 | A1 * | 3/2017 | Chiu ........................ G03F 1/62 |
| 2018/0046071 | A1 * | 2/2018 | Kohmura ................. G03F 1/60 |

FOREIGN PATENT DOCUMENTS

| | | | |
|---|---|---|---|
| CN | 103324034 | | 9/2013 |
| CN | 103901737 | | 7/2014 |
| EP | 3196700 | | 7/2017 |
| EP | 3291006 | | 3/2018 |
| GB | 2502533 | * | 12/2013 |
| JP | H0262542 | | 3/1990 |
| JP | 2013534727 | | 9/2013 |
| JP | 2015-18228 | | 1/2015 |
| JP | 2015523714 | | 8/2015 |
| JP | 2016151642 | | 8/2016 |
| KR | 10-2013-0088565 | | 8/2013 |
| KR | 2013088565 | A * | 8/2013 |
| NL | 2008533 | | 9/2013 |
| NL | 2010216 | | 8/2014 |
| TW | 201341969 | | 10/2013 |
| WO | 2014/142125 | | 9/2014 |
| WO | WO-2014154452 | A1 * | 10/2014 | .............. G03F 1/62 |
| WO | 2014/182169 | | 11/2014 |
| WO | 2014/188710 | | 11/2014 |
| WO | 2014/202585 | | 12/2014 |
| WO | 2015/082214 | | 6/2015 |
| WO | 2015/093699 | | 6/2015 |
| WO | WO-2015082214 | A1 * | 6/2015 | .............. G03F 1/24 |
| WO | 2015/160185 | | 10/2015 |
| WO | 2016/001351 | | 1/2016 |
| WO | 20170186486 | | 11/2017 |

OTHER PUBLICATIONS

Hawaldar et al., "Large-area high-throughput synthesis of monolayer graphene sheet by hit thermal chemical vapor deposition", Sci. Rep., vol. 2, article 682 (19 pages) (2012).*
Hsieh et al., "Promotor-assisted chemical vapor deposition of graphene", Carbon vol. 67 pp. 417-423 (2014).*
KR 10-20150003112 (priority document).*
Machine translation of KR 10-20160086024 (2016).*
Ni, et al., "Graphene thickness determination using reflection and contrast spectroscopy", Nanolett., vol. 7(9) pp. 2758-2763 (2007).*
Park et al. "Mechanical deflection of a free standing pellicle for extreme ultraviolet lithography" Microelectron. Eng., vol. 143 pp. 81-85 (Apr. 2015).*
Dhingra et al., "Chemical vapor deposition of graphene on large-domain ultra-flat copper", Carbon vol. 69 pp. 188-193 (2014).*
International Search Report and Written Opinion mailed Apr. 28, 2017 in corresponding International Patent Application No. PCT/EP2016/074280.
Fu, Qiang et al., "Electrodeposition of carbon films from various organic liquids," Surface and Coatings Technology, vol. 124, pp. 196-200 (2000).
Sirk, Aislinn H. C. et al., "Electrochemical Synthesis of Diamond-like Carbon Films," Journal of the Electrochemical Society, vol. 155, No. 5, pp. E49-E55 (2008).
Yoon, Taeshik et al., "Healing Graphene Defects Using Selective Electrochemical Deposition: Toward Flexible and Stretchable Devices," ACS Nano, vol. 10, No. 1, pp. 1539-1545 (Dec. 29, 2015).
Song, Jie et al., "A general method for transferring graphene onto soft surfaces," Nature Nanotechnology, vol. 8, No. 5, pp. 356-362 (2013).
Burg, Brian B. et al., "Dielectrophoretic integration of single- and few-layer graphenes," Journal of Applied Physics, vol. 107, pp. 034302-1-034302-6 (2010).
Balasubramanian, Kannan et al., "Electrochemically functionalized carbon nanotubes for device applications," Journal of Materials Chemistry, vol. 18, pp. 3071-3083 (2008).
Liu, Chengbin et al., "Direct Electrodeposition of Graphene Enabling the One-Step Synthesis of Graphene-Metal Nanocomposite Films", small, vol. 7, No. 9, pp. 1203-1206 (2011).
Yang, Zhi et al., "Sulfur-Doped Graphene as an Efficient Metal-free Cathode Catalyst for Oxygen Reduction," ACS Nano, vol. 6, pp. 205-211 (2012).
European Examination Report issued in corresponding European Patent Application No. 16788043.4, dated Mar. 31, 2020.
Chinese Office Action issued in corresponding Chinese Patent Application No. 2016800752316, dated Nov. 21, 2019.
Japanese Office Action issued in corresponding Japanese Patent Application No. 12018-519000, dated Jun. 17, 2020.
Novoselov, K.S. et al: "Electric Field Effect in Atomically Thin Carbon Films", Science, vol. 306, Issue 5696, pp. 666-669 (2004).
Taiwanese Office Action issued in corresponding Taiwanese Patent Application No. 105133981, dated May 22, 2020.

* cited by examiner

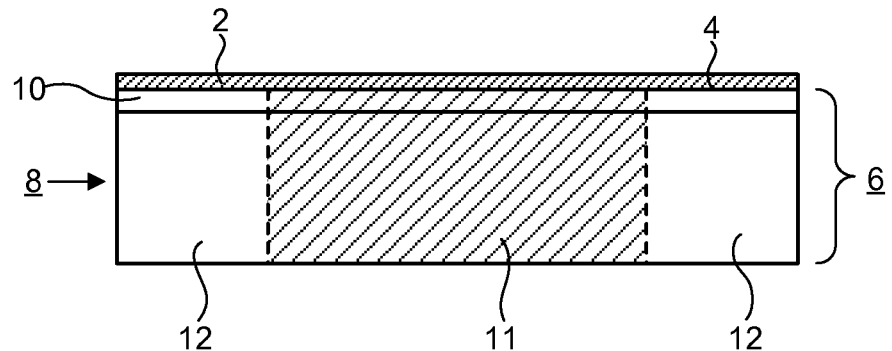
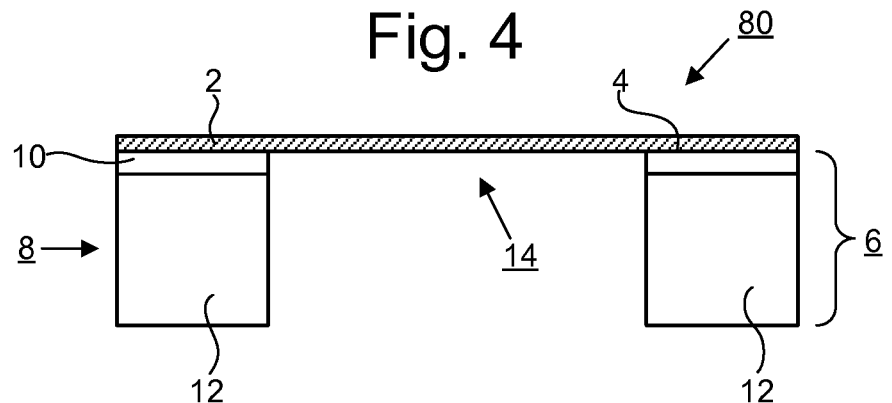
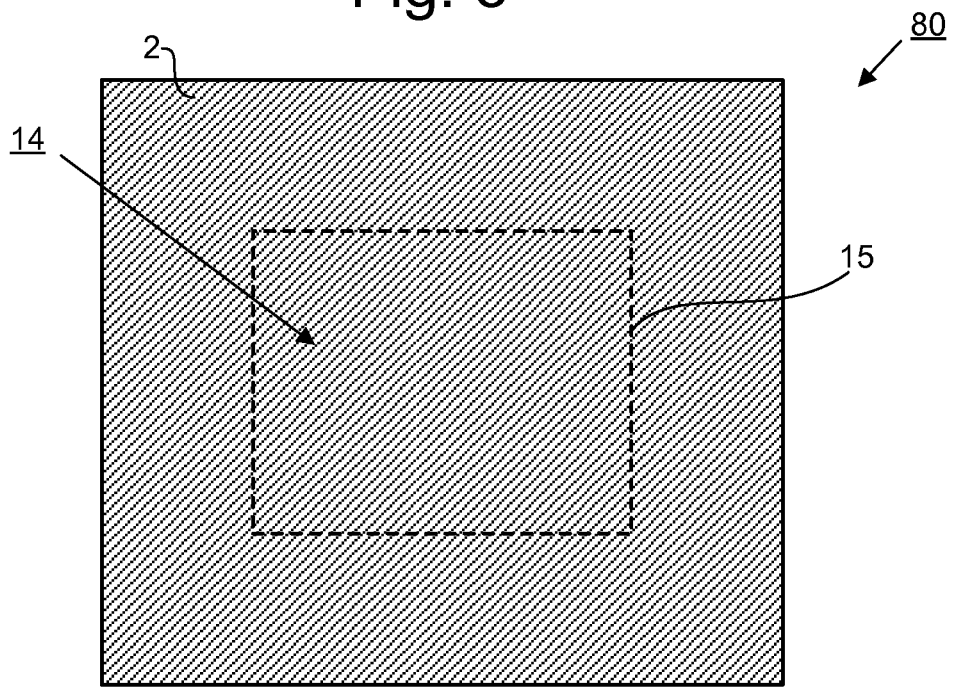

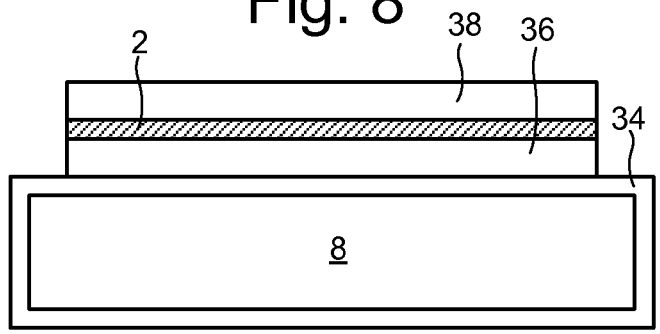
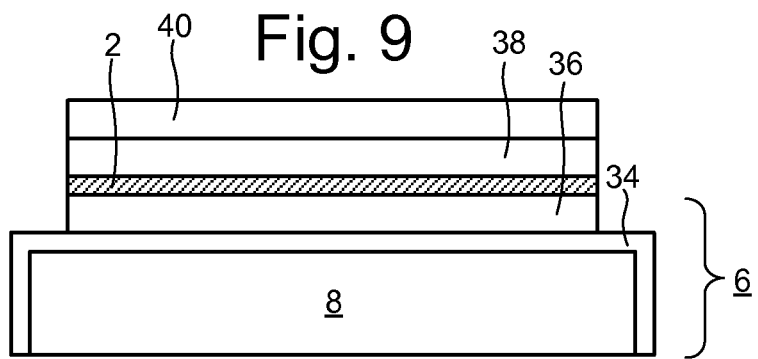
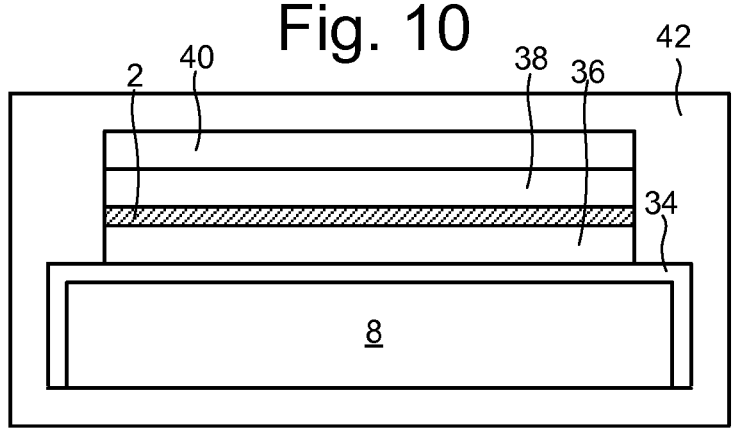

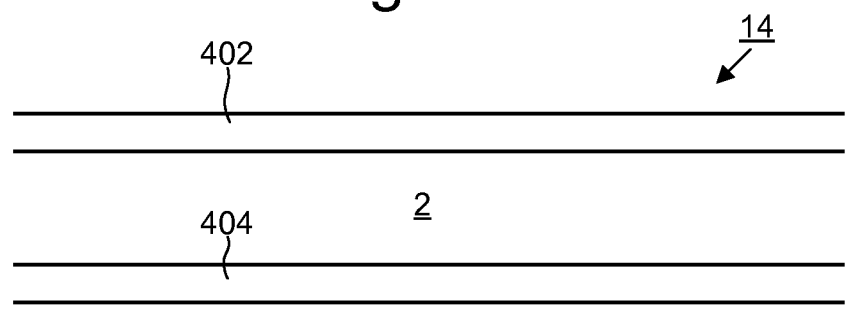
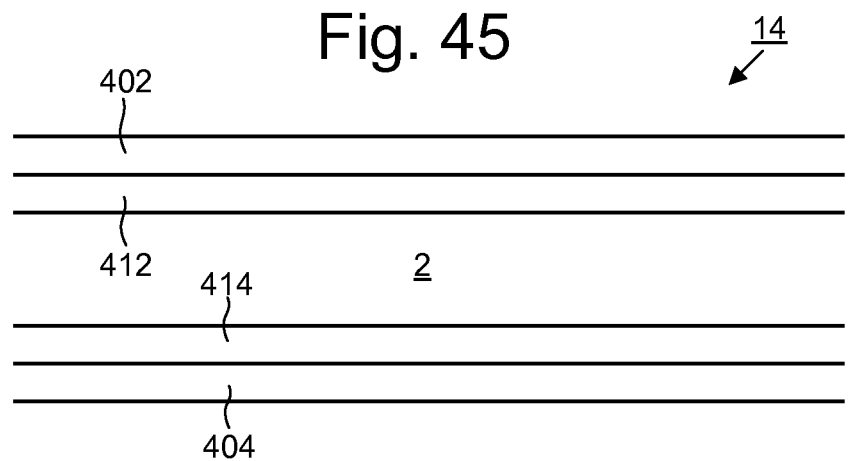

METHOD OF MANUFACTURING A PELLICLE FOR A LITHOGRAPHIC APPARATUS, A PELLICLE FOR A LITHOGRAPHIC APPARATUS, A LITHOGRAPHIC APPARATUS, A DEVICE MANUFACTURING METHOD, AN APPARATUS FOR PROCESSING A PELLICLE, AND A METHOD FOR PROCESSING A PELLICLE

CROSS-REFERENCE TO RELATED APPLICATIONS

This application is the U.S. national phase entry of PCT patent application no. PCT/EP2016/074280, which was filed on Oct. 11, 2016, which claims the benefit of priority of European patent application no. 15191052.8, which was filed on Oct. 22, 2015, and European patent application no. 16156637.7, which was filed on Feb. 22, 2016, and European patent application no. 16170384.8, which was filed on May 19, 2016, and European patent application no. 16186851.8, which was filed on Sep. 1, 2016, each of which is incorporated herein in its entirety by reference.

FIELD

The present invention relates to a method of manufacturing a pellicle for a lithographic apparatus, a pellicle for a lithographic apparatus, a lithographic apparatus, and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process-dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

A lithographic apparatus includes a patterning device (e.g., a mask or a reticle). Radiation is provided through or reflected off the patterning device to form an image on a substrate. A pellicle may be provided to protect the patterning device from airborne particles and other forms of contamination. Contamination on the surface of the patterning device can cause manufacturing defects on the substrate.

Pellicles may also be provided for protecting optical components other than patterning devices. Pellicles may also be used to provide a passage for lithography radiation between regions of the lithography apparatus which are sealed from each other. Pellicles may also be used as filters.

The pellicle may comprise a freestanding graphene membrane. A mask assembly may include the pellicle which protects a patterning device (e.g. a mask) from particle contamination. The pellicle may be supported by a pellicle frame, forming a pellicle assembly. The pellicle may be attached to the frame, for example by gluing a pellicle border region to the frame. The frame may be permanently or releasably attached to a patterning device. The freestanding graphene membrane may be formed by floating a thin film of graphene on a liquid surface and scooping the thin film onto a silicon frame. The quality of graphene membranes formed in this way has been found to be variable and difficult to control. Furthermore it is difficult to produce large graphene membranes reliably.

It has been found that the lifetime of pellicles comprising freestanding graphene membranes is limited.

It is desirable to improve consistency and control in methods of manufacturing pellicles using freestanding graphene membranes, improve the ability reliably to produce large pellicles using freestanding graphene membranes, or improve the lifetime of pellicles.

SUMMARY OF THE INVENTION

According to an aspect of the invention, there is provided a method of manufacturing a pellicle for a lithographic apparatus, comprising: depositing at least one graphene layer on a planar surface of a substrate, wherein the substrate comprises a first substrate portion and a second substrate portion; and removing the first substrate portion to form a freestanding membrane from the at least one graphene layer, the freestanding membrane being supported by the second substrate portion.

According to an aspect of the invention, there is provided a pellicle for a lithographic apparatus, comprising at least one graphene layer forming a freestanding membrane supported by a planar surface of a portion of a substrate on which the graphene layer was grown, said planar surface being located outside of the freestanding membrane when viewed in a direction perpendicular to the planar surface.

According to an aspect of the invention, there is provided a pellicle comprising a membrane bonded to a membrane support, wherein: the membrane comprises a graphene layer; and the membrane is bonded to and created on the membrane support with a thin film deposition process.

According to an aspect of the invention, there is provided a device manufacturing method comprising: using a patterning device to impart a pattern to a beam of radiation; using a pellicle comprising at least one graphene layer forming a freestanding membrane to protect the patterning device; and passing an electrical current through the at least one graphene layer to heat the at least one graphene layer.

According to an aspect of the invention, there is provided an apparatus for processing a pellicle, the pellicle comprising at least one graphene layer forming a freestanding membrane, the apparatus comprising: a current driving apparatus for driving an electrical current through the freestanding membrane to heat the at least one graphene layer.

According to an aspect of the invention, there is provided a method of processing a pellicle, the pellicle comprising at least one graphene layer forming a freestanding membrane, the method comprising driving an electrical current through the freestanding membrane to heat the freestanding membrane.

According to an aspect of the invention, there is provided a method of processing a pellicle, the pellicle comprising at least one graphene layer forming a freestanding membrane, the method comprising using electrochemical deposition to apply carbon to the at least one graphene layer.

According to an aspect of the invention, there is provided a method of manufacturing a pellicle for a lithographic apparatus, comprising: transferring at least one graphene layer from a surface of a liquid to a frame comprising an opening, thereby forming a freestanding membrane from the at least one graphene layer, the freestanding membrane spanning the opening and being supported by the frame, wherein a portion of the frame in contact with the at least one graphene layer is hydrophobic.

According to an aspect of the invention, there is provided a method of manufacturing a pellicle for a lithographic apparatus, comprising: transferring at least one graphene layer from a surface of a liquid to a frame comprising an opening, thereby forming a freestanding membrane from the at least one graphene layer, the freestanding membrane spanning the opening and being supported by the frame, wherein the liquid has a temperature in the range of 25-80 degrees Celsius during the transfer of the at least one graphene layer to the frame.

According to an aspect of the invention, there is provided a method of manufacturing a pellicle for a lithographic apparatus, comprising: transferring at least one graphene layer from a surface of a liquid to a frame comprising an opening, thereby forming a freestanding membrane from the at least one graphene layer, the freestanding membrane spanning the opening and being supported by the frame, wherein the liquid comprises water, an alcohol, and a further solvent that is not an alcohol.

According to an aspect of the invention, there is provided a pellicle comprising a freestanding membrane, the freestanding membrane comprising at least one layer of a two-dimensional material other than graphene.

According to an aspect of the invention, there are provided a pellicle assembly and a mask assembly comprising a freestanding membrane from the at least one graphene layer or another layer of a two-dimensional material.

According to an aspect of the invention, there is provided a method of manufacturing a pellicle for a lithographic apparatus, comprising: depositing at least one layer of a two-dimensional material on a planar surface of a substrate, wherein the substrate comprises a first substrate portion and a second substrate portion; and removing the first substrate portion to form a freestanding membrane from the at least one layer of a two-dimensional material, the freestanding membrane being supported by the second substrate portion.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 3 is a schematic side sectional view of a substrate and at least one graphene layer prior to processing to form a pellicle;

FIG. 4 depicts the arrangement of FIG. 3 after processing to form a pellicle;

FIG. 5 is a schematic top view of the pellicle of FIG. 4;

FIG. 8 is a schematic side sectional view of the arrangement of FIG. 7 after further processing to form a second graphene-support layer;

FIG. 9 is a schematic side sectional view of the arrangement of FIG. 8 after further processing to form a further layer on the second graphene-support layer and remove a portion of the silicon oxide layer on a lower surface;

FIG. 10 is a schematic side sectional view of the arrangement of FIG. 9 after further processing to form an encapsulation layer or sacrificial layer;

FIG. 44 is a schematic side sectional view of a portion of an at least one graphene layer with a capping layer on a top surface and on a bottom surface of the at least one graphene layer;

FIG. 45 is a schematic side sectional view of a portion of an at least one graphene layer with a capping layer on a top surface and on a bottom surface of the at least one graphene layer, and an adhesion layer in between each of the capping layers and the at least one graphene layer;

Figure 1:
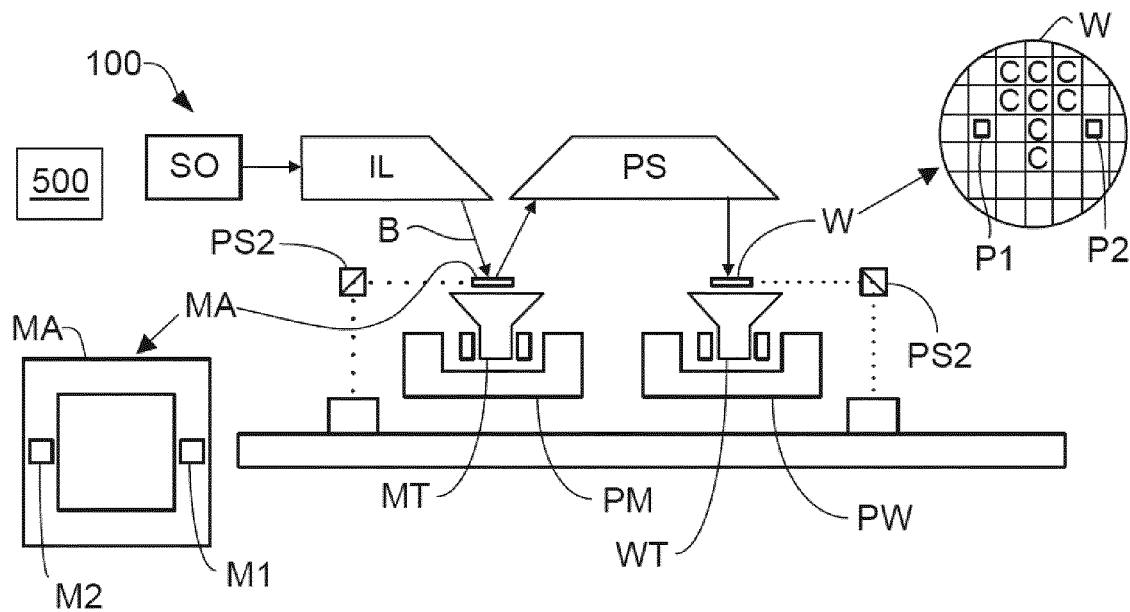
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

FIG. 1 schematically depicts a lithographic apparatus 100 including a source collector module SO according to one embodiment of the invention. The apparatus 100 comprises:

- an illumination system (or illuminator) IL configured to condition a radiation beam B (e.g., EUV radiation).
- a support structure (e.g., a mask table) MT constructed to support a patterning device (e.g., a mask or a reticle) MA and connected to a first positioner PM configured to accurately position the patterning device;
- a substrate table (e.g., a wafer table) WT constructed to hold a substrate (e.g., a resist-coated wafer) W and connected to a second positioner PW configured to accurately position the substrate; and
- a projection system (e.g., a reflective projection system) PS configured to project a pattern imparted to the radiation beam B by patterning device MA onto a target portion C (e.g., comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" should be broadly interpreted as referring to any device that can be used to impart a radiation beam B with a pattern in its cross-section such as to create a pattern in a target portion C of the substrate W. The pattern imparted to the radiation beam B may correspond to a particular functional layer in a device being created in the target portion C, such as an integrated circuit.

The patterning device MA may be transmissive or reflective. Examples of patterning devices include masks, programmable mirror arrays, and programmable liquid-crystal display (LCD) panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The projection system PS, like the illumination system IL, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the lithographic apparatus 100 is of a reflective type (e.g., employing a reflective mask).

The lithographic apparatus 100 may be of a type having two (dual stage) or more substrate tables WT (and/or two or more support structures MT). In such a "multiple stage" lithographic apparatus the additional substrate tables WT (and/or the additional support structures MT) may be used in parallel, or preparatory steps may be carried out on one or more substrate tables WT (and/or one or more support structures MT) while one or more other substrate tables WT (and/or one or more other support structures MT) are being used for exposure.

Referring to FIG. 1, the illumination system IL receives an extreme ultraviolet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module SO may be separate entities, for example when a $CO_2$ laser is used to provide the laser beam for fuel excitation.

In such cases, the laser is not considered to form part of the lithographic apparatus 100 and the radiation beam B is passed from the laser to the source collector module SO with the aid of a beam delivery system comprising, for example, suitable directing mirrors and/or a beam expander. In other cases the source may be an integral part of the source collector module SO, for example when the source is a discharge produced plasma EUV generator, often termed as a DPP source.

The illumination system IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illumination system IL can be adjusted. In addition, the illumination system IL may comprise various other components, such as facetted field and pupil mirror devices. The illumination system IL may be used to condition the radiation beam B, to have a desired uniformity and intensity distribution in its cross-section.

The radiation beam B is incident on the patterning device (e.g., mask) MA, which is held on the support structure (e.g., mask table) MT, and is patterned by the patterning device MA. After being reflected from the patterning device (e.g., mask) MA, the radiation beam B passes through the projection system PS, which focuses the radiation beam B onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. The patterning device (e.g., mask) MA and the substrate W may be aligned using mask alignment marks M1, M2 and substrate alignment marks P1, P2.

A controller 500 controls the overall operations of the lithographic apparatus 100 and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus 100. It will be appreciated that a one-to-one relationship between controlling computer and lithographic apparatus 100 is not necessary. In an embodiment of the invention one computer can control multiple lithographic apparatuses 100. In an embodiment of the invention, multiple networked computers can be used to control one lithographic apparatus 100. The controller 500 may also be configured to control one or more associated process devices and substrate handling devices in a lithocell or cluster of which the lithographic apparatus 100 forms a part. The controller 500 can also be configured to be subordinate to a supervisory control system of a lithocell or cluster and/or an overall control system of a fab.

Figure 2:
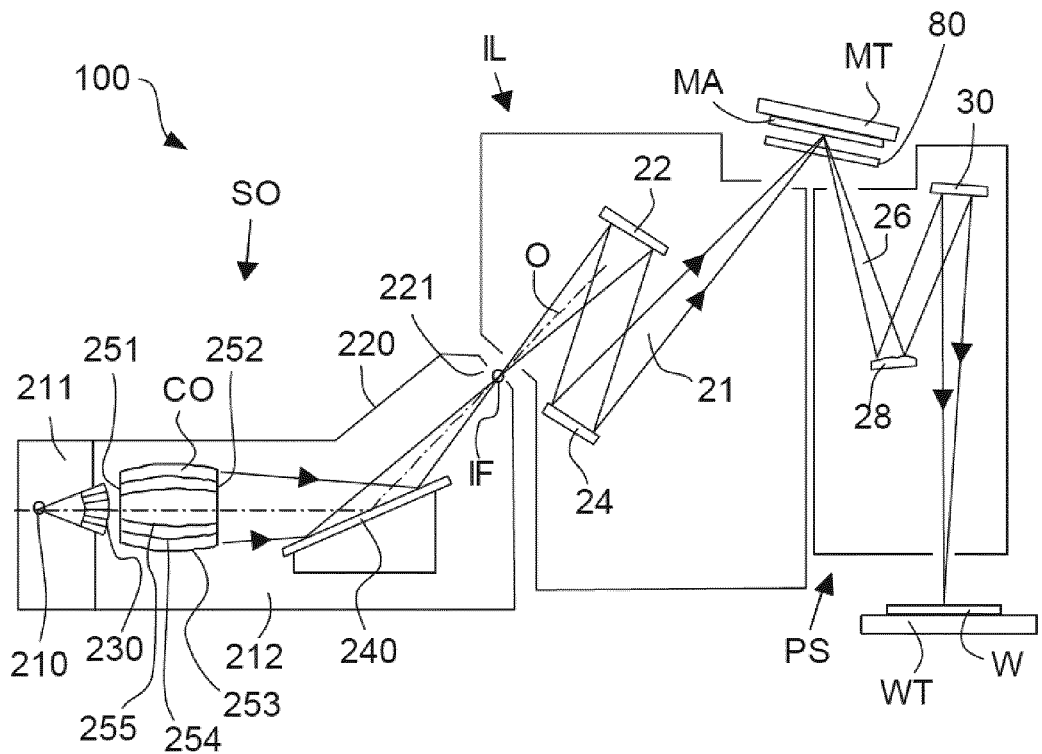
FIG. 2 is a more detailed view of the lithographic apparatus.

FIG. 2 shows the lithographic apparatus 100 in more detail, including the source collector module SO, the illumination system IL, and the projection system PS. An EUV radiation emitting plasma 210 may be formed by a plasma source. EUV radiation may be produced by a gas or vapor, for example Xe gas, Li vapor or Sn vapor in which the radiation emitting plasma 210 is created to emit radiation in the EUV range of the electromagnetic spectrum. In an embodiment, a plasma of excited tin (Sn) is provided to produce EUV radiation.

The radiation emitted by the radiation emitting plasma 210 is passed from a source chamber 211 into a collector chamber 212.

The collector chamber 212 may include a radiation collector CO. Radiation that traverses the radiation collector CO can be focused in a virtual source point IF. The virtual source point IF is commonly referred to as the intermediate focus, and the source collector module SO is arranged such that the virtual source point IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the unpatterned beam 21, at the patterning device MA, as well as a desired uniformity of radiation intensity at the patterning device MA. Upon reflection of the unpatterned beam 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in the illumination system IL and the projection system PS. Further, there may be more mirrors present than those shown in the Figures, for example there may be 1-6 additional reflective elements present in the projection system PS than shown in FIG. 2.

Alternatively, the source collector module SO may be part of an LPP radiation system.

As depicted in FIG. 1, in an embodiment the lithographic apparatus 100 comprises an illumination system IL and a projection system PS. The illumination system IL is configured to emit a radiation beam B. The projection system PS is separated from the substrate table WT by an intervening space. The projection system PS is configured to project a pattern imparted to the radiation beam B onto the substrate W. The pattern is for EUV radiation of the radiation beam B.

The space intervening between the projection system PS and the substrate table WT can be at least partially evacuated. The intervening space may be delimited at the location of the projection system PS by a solid surface from which the employed radiation is directed toward the substrate table WT.

In an embodiment the lithographic apparatus 100 comprises a dynamic gas lock. The dynamic gas lock comprises a pellicle 80. In an embodiment the dynamic gas lock comprises a hollow part covered by a pellicle 80 located in the intervening space. The hollow part is situated around the path of the radiation. In an embodiment the lithographic apparatus 100 comprises a gas blower configured to flush the inside of the hollow part with a flow of gas. The radiation travels through the pellicle 80 before impinging on the substrate W.

In an embodiment the lithographic apparatus 100 comprises a pellicle 80. As explained above, in an embodiment the pellicle 80 is for a dynamic gas lock. In this case the pellicle 80 functions as a filter for filtering DUV radiation. Additionally or alternatively, in an embodiment the pellicle 80 protects an optical element, for example a patterning device MA. The pellicle 80 of the present invention can be used for a dynamic gas lock or for protecting an optical element or for another purpose.

In an embodiment the pellicle 80 is configured to seal off the patterning device MA to protect the patterning device MA from airborne particles and other forms of contamination. Contamination on the surface of the patterning device MA can cause manufacturing defects on the substrate W. For example, in an embodiment the pellicle 80 is configured to reduce the likelihood that particles might migrate into a stepping field of the patterning device MA in the lithographic apparatus 100.

If the patterning device MA is left unprotected, the contamination can require the patterning device MA to be cleaned or discarded. Cleaning the patterning device MA interrupts valuable manufacturing time and discarding the patterning device MA is costly. Replacing the patterning device MA also interrupts valuable manufacturing time.

In the embodiments described below references to upper/lower, up/down, top/bottom, above/below, etc. are made relative to the orientations on the page of the side sectional views. A front side of the pellicle faces upwards and a back side of the pellicle faces downwards. The substrate 6 is therefore always located on a back side of the at least one graphene layer 2 within this convention.

FIGS. 3-5 schematically depict stages in a method of manufacture of a pellicle 80 according to an embodiment. The method comprises depositing at least one graphene layer 2 on a planar surface 4 of a substrate 6. The substrate 6 may comprise a single layer or multiple layers of material. In an embodiment, the substrate 6 comprises a base layer 8 and one or more further layers 10 formed on top of the base layer 8. In an embodiment, the base layer 8 comprises a silicon wafer. In other embodiments, the base layer 8 may be formed from other materials.

In an embodiment, the substrate 6 comprises a first substrate portion 11 and a second substrate portion 12. The method of manufacture of the pellicle 80 comprises removing the first substrate portion 11 to form a freestanding membrane 14 from the at least one graphene layer 2. The freestanding membrane 14 is supported by the second substrate portion 12. In an embodiment the freestanding membrane 14 is at least 80% transparent to EUV radiation used in an EUV lithographic apparatus such as 13.5 nm or 6.7 nm (e.g. 80% transparent to radiation having a wavelength of 13.5 nm or 6.7 nm), optionally at least 90% (e.g. 90% transparent to radiation having a wavelength of 13.5 nm or 6.7 nm), optionally at least 95% (e.g. 95% transparent to radiation having a wavelength of 13.5 nm or 6.7 nm).

In the embodiments described below with reference to FIGS. 3-36 the freestanding membrane 14 is formed exclusively from a portion of the at least one graphene layer 2, optionally with a coating. Each of the embodiments, and other embodiments, can however be adapted so that the freestanding membrane 14 comprises a portion of the at least one graphene layer 2 in combination with an additional layer on an upper surface of the graphene layer 2 or an additional layer on a lower surface of the graphene layer 2. An example of such an embodiment is shown schematically in FIG. 37, where an additional layer 3 is formed on an upper surface of the at least one graphene layer 2 and an additional layer 5 is formed on a lower surface of the at least one graphene layer 2. Such additional layers may be formed for example by stopping an etching process configured to remove a layer adjacent to the at least one graphene layer 2 before the layer has been completed removed. In the particular example shown in FIG. 37, the additional layers 3 and 5 are formed by stopping the etching away of graphene-support layers 36 and 38 before the at least one graphene layer 2 is reached, thereby forming additional layers 3 and 5 from thin layers of the material forming the graphene-support layers 36 and 38. Further details about the graphene-support layers 36 and 38 are given below. In other embodiments, the additional layers 3 and 5 may have a different composition. The additional layers 3 and 5 may provide additional mechanical support for the freestanding membrane 14. The additional layers 3 and 5 are configured to be thin enough that the freestanding membrane 14 remains adequately transparent to radiation that is to be transmitted through the freestanding membrane 14 (e.g. EUV radiation, as described above).

It is understood in the field of pellicles that a freestanding membrane is to be distinguished from a mesh-supported membrane. A freestanding membrane spans freely over a continuous area without any supports positioned within the area (when viewed perpendicular to the freestanding membrane). A mesh-supported membrane, in contrast, is supported by a mesh positioned in the area over which the membrane spans (when viewed perpendicular to the membrane).

In an embodiment, the at least one graphene layer 2 consists of a single layer of graphene, a bilayer of graphene or more than two monolayers of graphene (e.g. between 3 and 50 layers of graphene, optionally between 10 and 50 layers of graphene). A single layer, or a small number of layers, of graphene provides good transparency, particularly where folds and other imperfections are minimized. Higher numbers of graphene layers are more robust. It has been found that 10 layers of graphene and above provides satisfactory rigidity in a range of embodiments. It has also been found that less than 50 layers of graphene provides satisfactory transparency in a range of embodiments (e.g. 90% transmission of EUV radiation).

Graphene is understood to mean a one atom thick layer of graphite: a layer of sp2 bonded carbon atoms in a hexagonal or honeycomb lattice. Multiple layers of graphene are sometimes referred to as graphite, particularly where the number of layers is larger than about 10 layers. As the number of sheets of graphene increases the electronic structure becomes increasingly similar to, and eventually indistinguishable from, bulk graphite. Multiple layers of graphene (or graphite) are also sometimes referred to as graphite nanoplatelets or graphene nanoplatelets.

In an embodiment one or more of the layers in the at least one graphene layer 2 may comprise one or more layers of graphene derivatives, such as functionalized graphene or graphene with modifications, such as oxidized graphene, graphane, graphyne, fluorinated graphene, graphene bromide, graphene chloride, graphene iodide and graphene with other functionalities attached to the graphene. Graphene and graphene derivatives have in common that they are all membranes which have carbon sp2 bonded bases. The mechanical properties of graphene derivatives may be the same or similar to the mechanical properties of graphene, although the chemical properties may be different. Graphene fluoride may provide the advantage that it has bonds which are less susceptible than graphene bonds to breaking when illuminated by EUV radiation.

In an embodiment a coating is provided on the freestanding membrane 14. The coating is configured to protect the at least one graphene layer 2 of the freestanding membrane 14. The coating may provide one or more of thermal protection, mechanical protection, and chemical protection.

In the example shown in FIGS. 3-5, the freestanding membrane 14 comprises a portion of the at least one graphene layer 2 delimited by a boundary line 15 (see FIG. 5) marking the edge of the first substrate portion 11. The freestanding membrane 14 is thus formed from the portion of the at least one graphene layer 2 that was positioned over the first substrate portion 11. The freestanding membrane 14 is thus not supported by any material positioned immediately below the freestanding membrane 14 (i.e. along a direction perpendicular to the planar surface 4 of the substrate 6).

In an embodiment, the first substrate portion 11 is removed by selective etching of the substrate 6. In an embodiment, an encapsulation layer or sacrificial layer is coated at least over a front and side surface of a stack comprising the at least one graphene layer 2 and the substrate 6 during the removal of the first substrate portion 11. The encapsulation layer or sacrificial layer provides mechanical support to the stack during the processing to remove the first substrate portion 11, which can involve relatively long etching steps. Covering of the side surface prevents unwanted ingress of etchant into the stack from the sides. The encapsulation layer or sacrificial layer may comprise any suitable material that is resistant to the processing steps (e.g. etching) needed to remove the first substrate portion 11. In an embodiment the encapsulation layer or sacrificial layer comprises an organic polymer. In an embodiment the encapsulation layer or sacrificial layer comprises a poly(p-xylylene) polymer such as Parylene or ProTEK® type materials. In an embodiment the encapsulation layer or sacrificial layer comprises PMMA. In other embodiments the encapsulation or sacrificial material comprises an inorganic material, such as a metal layer. Examples of different encapsulation or sacrificial layers are mentioned below with reference to the detailed examples of FIGS. 6-36.

In an embodiment, the first substrate portion 11 comprises a continuous volume of material positioned underneath a portion of the at least one graphene layer 2 that will form the freestanding membrane 14. In an embodiment, the first substrate portion 11 is surrounded by the second substrate portion 12 when viewed in a direction perpendicular to the planar surface 4 of the substrate 6 (i.e. in a vertical direction in the page in the orientation of the side sectional views in the figures). Configuring the second substrate portion 12 in this way helps to provide reliable and spatially homogeneous support to the freestanding membrane 14. In such an embodiment, removal of the first substrate portion 11 forms a hole passing through the substrate 6 in a direction perpendicular to the planar surface 4. The hole is spanned continuously (i.e. with no gaps) by the freestanding membrane 14. A pellicle 80 formed in this way may be configured such that the freestanding membrane 14 spans continuously (i.e. with no gaps) across an optical element (e.g. patterning device MA) to be protected by the pellicle 80.

The freestanding membrane 14 is supported by the second substrate portion 12. In an embodiment the support is provided by adhesion of a portion of the at least one graphene layer 2 to the second substrate portion 12. In the example shown in FIG. 5 the adhesion occurs in the region outside of the boundary line 15. The freestanding membrane 14 is thus supported laterally via the portion of the at least one graphene layer that is positioned over the second substrate portion 12.

The freestanding membrane 14 may remain substantially planar even after the first substrate portion 11 has been removed. Alternatively, the freestanding membrane 14 may sag under its own weight. The amount of sag may be controlled by changing a tension in the freestanding membrane 14. The amount of sag that is acceptable will depend on the particular application of the pellicle 80. In embodiments where the pellicle 80 protects an optical element, such as the patterning device MA, it may be desirable to arrange for the sag to be small enough to avoid contact between the pellicle 80 and the optical element. For example in one embodiment the pellicle 80 is positioned about 2±0.5 mm from the patterning device MA and the tension in the freestanding membrane 14 is set so that a maximum sag in use will not exceed about 500 microns.

In an embodiment the freestanding membrane 14 has a surface area of at at least 1 $mm^2$, preferably at least 10 $mm^2$, preferably at least 100 $mm^2$, preferably at least 1000 $mm^2$, preferably at least 5000 $mm^2$, preferably at least 10000 $mm^2$, when viewed in a direction perpendicular to the planar surface 4 of the substrate 6. The minimum size of the freestanding membrane 14 will depend on the particular application in question and may be significantly larger than this value. Where the pellicle 80 is to protect an optical component, the freestanding membrane 14 will typically be configured to be at least as large as a cross-sectional area through which all radiation incident on the optical element, and/or all radiation leaving the optical element, passes.

Forming the freestanding membrane 14 using the above methods provides several benefits. High quality adhesion is achieved between the second substrate portion 12 and the at least one graphene layer 2 because the at least one graphene layer 2 remains on the surface on which it was originally deposited. The problems of folding, entrapment of gas bubbles and tearing of the graphene, which have been observed to occur when handling graphene films floating on liquids, are avoided. Tension in the freestanding membrane 14 can be controlled accurately and reliably. Variations in tension due to unpredictable adhesion and handling variations, which have been observed to occur when handling graphene films floating on liquids, are avoided. The techniques used in the method, including the depositing of graphene and processing of the substrate to selectively remove a part of the substrate, can be scaled up to allow larger freestanding membranes to be formed reliably.

Figure 6:
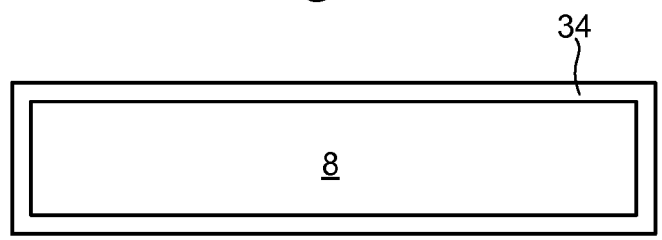
FIG. 6 is a schematic side sectional view of a silicon base layer after processing to form a silicon oxide layer.
Figure 7:
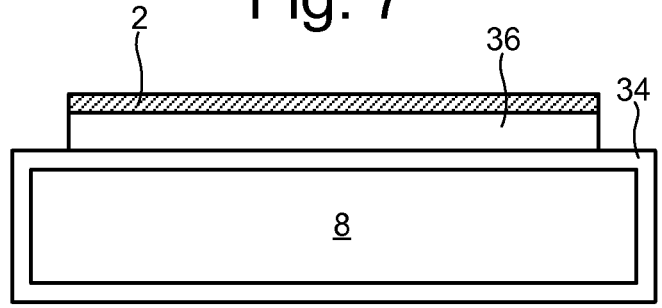
FIG. 7 is a schematic side sectional view of the arrangement of FIG. 6 after further processing to form at least one graphene layer on a first graphene-support layer.

FIGS. 6 and 7 schematically depict initial stages in a method of manufacturing the pellicle 80 according to an embodiment. In this embodiment a base layer 8 comprising a silicon wafer is processed to form a silicon oxide layer 34 ($SiO_2$) on an outer surface of the silicon wafer (FIG. 6). The processing may comprise thermal processing.

In a subsequent step a graphene-support layer 36 is formed on an upper surface of the silicon oxide layer 34. In an embodiment the graphene-support layer 36 comprises a layer of metal or a metal in silicized form. In an embodiment, the graphene-support layer 36 comprises one or more of the following: transition metals such as Mo, Ni, Ru, Pt, Cu, Ti, V, Zr, Nb, Hf, Ta, W, Cr, silicized Mo, silicized Ni, silicized Ru, silicized Pt, silicized Cu, silicized Ti, silicized V, silicized Zr, silicized Nb, silicized Hf, silicized Ta, silicized W, silicized Cr, carbide of Mo, carbide of Ni, carbide of Ru, carbide of Pt, carbide of Cu, carbide of Ti, carbide of V, carbide of Zr, carbide of Nb, carbide of Hf, carbide of Ta, carbide of W, carbide of Cr.

In this context, the reference to a silicized metal is understood to mean a layer of the metal covered by a layer of the metal silicide at a surface. It has been found that the metal silicide tends to have a lower melting point than the corresponding metal, which means that the graphene can be grown in conditions in which the metal part of the graphene-support layer is solid and the metal silicide part of the graphene-support layer is a liquid or liquid-like. The liquid or liquid-like surface provided by the metal silicide provides a very smooth surface for the graphene layer, thereby improving the quality of the graphene layer. Use of Mo or silicized Mo may be particularly desirable because it is possible to directly synthesize high quality multilayer graphene on Mo or silicized Mo using CVD. Multilayer graphene may be more robust that single layer graphene while still providing adequate transparency to radiation. Where Mo or silicized Mo is used a controllable and uniform thickness can be achieved by controlling the CVD process. The direct synthesis avoids the need to manually transfer multiple individual monolayers formed using other processes, for example using CVD on a graphene-support layer formed from Cu. The process of transferring the individual monolayers would tend to increase defectivity relative to direct formation without any transfer. Multilayer graphene can also be formed directly on graphene-support layers comprising Ni but the quality tends to be inferior in comparison to Mo or silicized Mo. For example a non-continuous layer comprising flakes may be formed.

The quality of graphene when growth by CVD may be largely influenced by the catalyst surface on which it grows, mostly because the grown graphene will follow the catalyst surface conformally. The catalyst surface may provide morphological changes at the high temperature required to grow graphene. Grain boundaries of the catalyst surface may occur and graphene may grow over surface grain boundaries sporadically. Reduction of the grain boundaries may be done by optimization for larger grain sizes, by influencing the growth rate dependence on crystal orientation by forming epitaxial layers or monocrystalline layers, by the improvement of layer thickness and layer thickness uniformity of CVD grown graphene and/or by improvement or changes in catalyst surface roughness. The catalyst surface can be optimized by optimization of gran sizes, which is influenced by temperature, growth time, internal stress and roughness. Epitaxial or monocrystalline surfaces may be formed by sputtering or CVD or any other PVD technique. A better quality graphene will improve imaging performance and the pellicle life time.

Transition metal carbides from metals in groups IVB, VB and VIB in the Periodic Table, such as the carbides of Mo, Ni, Ru, Pt, Cu, Ti, V, Zr, Nb, Hf, Ta, W, Cr mentioned above, exhibit catalytic activity which resembles that of noble metals. These catalysts are particularly active towards dehydrogenation and aromatization of hydrocarbons and therefore provide a particularly suitable support for synthesis of graphene. In practice, when graphene is grown on a nominally bare surface of a metal from group IVB, VB or VIB, it is expected that for some metals a layer of a carbide of the metal will be formed (e.g. a surface layer of the metal will be partially or completely converted to the carbide) initially as part of the process of forming the at least one graphene layer 2 on the graphene-support layer 36. This is expected for example in the case of Mo due to the negative enthalpy of formation of $Mo_2C$. For metals or processes where this does not occur, a separate process may be provided for forming the carbide on the metal prior to formation of the at least one graphene layer 2. In either case, where it is expected that the at least one graphene layer 2 will be formed on a carbide layer, the process (e.g. CVD) for forming the at least one graphene layer 2 should be adapted to take the carbide layer into account. The carbide layer provides opportunities to pursue different strategies towards optimizing the growth of the at least one graphene layer 2. For example, it is possible to control properties of the surface of the carbide to improve the formation of the at least one graphene layer 2. Properties such as surface morphology, grain size and crystal orientation may be controlled for example. Account may be taken of the growth mechanism of the at least one graphene layer 2 on the carbide. The growth mechanism may involve for example growth from the bulk by either isothermal growth or segregation upon cooling or growth from the surface by chemisorption. The growth mechanism may involve epitaxial growth by direct deposition of the graphene with a desired crystal orientation. The overall thickness of the at least one graphene layer 2 may be controlled based on differences in diffusion coefficients versus crystal orientation.

In a variation on the above embodiments the step of forming the silicon oxide layer is omitted and the graphene-support layer 36 is formed directly on the base layer 8 (e.g. directly on a silicon wafer).

Due to the relatively low solid-solubility of C in Mo and the relatively high diffusion coefficient of Mo in C, the rate limiting step for growth of the at least one graphene layer 2 on Mo is the low solid-solubility. The low solid-solubility will limit the thickness of the at least one graphene layer 2 that can be efficiently grown directly on Mo. In an embodiment, the at least one graphene layer 2 is grown on silicized Mo (e.g. $MoSi_2$). The solid-solubility of C in $MoSi_2$ is higher than the solid-solubility of C in Mo, thereby allowing the thickness of the at least one graphene layer 2 to be increased. In an embodiment, the silicized Mo (e.g. $MoSi_2$) is provided in a tetragonal phase form. The tetragonal phase form provides a better epitaxial match with the at least one graphene layer 2 (the lattices of $MoSi_2$ and graphene are more similar than the lattices of Mo and graphene). Providing an improved epitaxial match will promote growth of an at least one graphene layer 2 with fewer defects and grain boundaries. In an embodiment, the graphene-support layer 36 comprises a layer of Mo and a layer of silicized Mo (e.g. $MoSi_2$) grown on the layer of Mo. In an embodiment the layer of Mo has a thickness of 50-100 nm and the layer of silicized Mo (e.g. $MoSi_2$) has a thickness of 5-50 nm. The layer of silicized Mo (e.g. $MoSi_2$) may be grown by sputtering (or any other suitable physical or chemical deposition technique). In an embodiment an annealing step is performed to drive a phase transition of the grown layer of silicized Mo (e.g. $MoSi_2$) from a hexagonal phase to the desired tetragonal phase. In an embodiment the annealing comprises heating the layer of silicized Mo (e.g. $MoSi_2$) at a minimum temperature of 1000 degrees C. for a minimum time of 20 minutes. FIG. 6B depicts an example configuration in which a graphene-support layer 36 comprises a Mo layer 36A and a silicized Mo (e.g. $MoSi_2$) layer 36B. The silicized Mo (e.g. $MoSi_2$) layer 36B was grown directly on the Mo layer 36A and subsequently annealed as discussed above to provide the silicized Mo (e.g. $MoSi_2$) in the tetragonal (epitaxially matching) phase.

In a subsequent step the at least one graphene layer 2 is formed on the graphene-support layer 36. In an embodiment, the at least one graphene layer 2 is formed by chemical vapor deposition (CVD). The number of graphene layers 2 in the at least one graphene layer 2 may depend on the composition of the graphene-support layer 36. For example, where the graphene-support layer 36 comprises Cu, CVD will typically produce a monolayer of graphene. CVD on Ni or Mo can produce multilayers. The resulting structure is shown in FIG. 7.

In an embodiment the graphene-support layer 36 has a root mean squared roughness of less than 5 nm, optionally less than 1 nm, optionally less than 0.5 nm, optionally less than 0.1 nm. Increasing the smoothness of the graphene-support layer 36 reduces the risk of significant folding in, or other disruption to, the portion of the at least one graphene layer 2 that forms the freestanding membrane 14 when the underlying graphene-support layer 36 is removed. Increasing the smoothness will also tend to increase the tension in the freestanding membrane 14 because the surface area of the graphene will tend to be lower where it does not have to follow large irregularities in the surface on which it is deposited. Conversely, decreasing the smoothness will tend to decrease the tension in the freestanding membrane 14. In an embodiment the degree of smoothness of the graphene-support layer 36 is selected to achieve a desired tension in the freestanding membrane 14 during use. Alternatively, one or both of thermal and chemical processing may be applied to the at least one graphene layer 2, and/or to one or more surrounding layers, to achieve a desired tension in the freestanding membrane 14 during use.

In an embodiment, the substrate 6 comprises a base layer 8, a first graphene-support layer 36 and a second graphene-support layer 38. The at least one graphene layer 2 is formed on the first graphene-support layer 36 and the second graphene-support layer is formed on top of the at least one graphene layer 2. The first graphene-support layer 36 and the second graphene-support layer 38 may have the same composition or a different composition.

Arranging for the first and second graphene-support layers 36 and 38 to have the same composition, for example both comprising Mo or silicized Mo, and/or the same thickness, may desirably balance capillary forces exerted on the at least one graphene layer 2 during wet etching steps.

Arranging for the first and second graphene-support layers 36 and 38 to have different compositions or thicknesses may be used to control a tension in the freestanding membrane 14 to be formed. For example, the second graphene-support layer 38, which may still be present after the freestanding membrane 14 has been formed, may be selected to act as a control layer for controlling the tension. For example, the second graphene-support layer 38 may be formed from a material that can be processed to change a tension in the freestanding membrane 14. For example, the material may shrink on heating and thereby pull the freestanding membrane 14 into a state of higher tension. Control layers are discussed in further detail below, particularly in relation to the embodiments discussed with reference to FIGS. 29-36.

In one embodiment the first graphene-support layer 36 comprises a metal or silicized metal and the second graphene-support layer 38 comprises hexagonal boron nitride. Hexagonal boron nitride is chemically more insert than graphene so a thin layer of the hexagonal boron nitride can be left on the at least one graphene layer 2 as a coating or additional layer to protect the graphene and/or act to reduce DUV reflection.

The combination of the first graphene-support layer 36 and the second graphene-support layer 38 protects the at least one graphene layer 2 during subsequent processing steps (e.g. preventing damage to the graphene or to the adhesion between the graphene and other layers), provides mechanical support to the at least one graphene layer 2 (e.g. facilitating handling), or both.

FIGS. 8-10 depict example stages in a manufacturing method starting from the arrangement of FIG. 7 in the case where both of a first graphene-support layer 36 and a second graphene-support layer 38 are provided. In this example the second graphene-support layer 38 is formed by e-beam evaporation (or other deposition technique) to provide the arrangement shown in FIG. 8. Subsequently, a further layer 40 is formed on the second graphene-support layer 38. The further layer 40 may comprise one or more of the following: an adhesion layer, a plasma-enhanced chemical vapor deposition (PECVD) tetraethylorthosilicate (TEOS) layer, or a PECVD oxide layer. The further layer 40 provides further protection during subsequent processing steps. The further layer 40 provides predictable and therefore reliable adhesion with encapsulation layer or sacrificial layer 42 or further encapsulation layer or sacrificial layer 48 (e.g. Parylene). The further layer 40 may protect the graphene-support layer 38 from attack by etching steps, such as the $O_2$ barrel etch mentioned below. The further layer 40 may also increase the symmetry of the stack, thereby providing improved mechanical support for the at least one graphene layer 2.

In a subsequent step the silicon oxide layer 34 on a lower surface of the base layer 8 is removed by etching to provide the structure shown in FIG. 9.

In a subsequent step the structure is encapsulated in an encapsulation layer or sacrificial layer 42 (which may be referred to as an etch mask) to provide the structure shown in FIG. 10. In an embodiment the encapsulation layer or sacrificial layer 42 comprises $Si_xN_y$, but other materials may also be used depending the etching processes to be used in subsequent steps. The encapsulation layer or sacrificial layer 42 should be resistant to at least a subset of etchants used in subsequent steps. In other embodiments the encapsulation layer or sacrificial layer 42 is omitted from the top of the stack.

Figure 11:
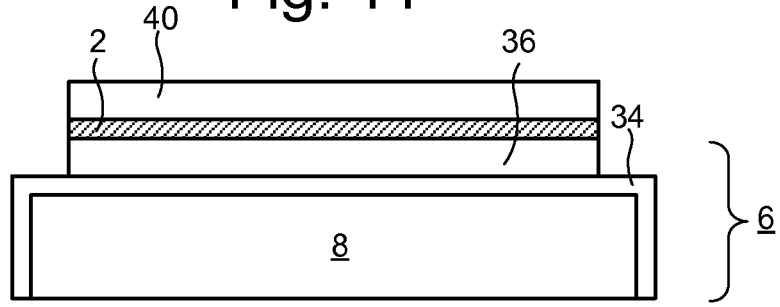
FIG. 11 is a schematic side sectional view of the arrangement of FIG. 7 after further processing to form a further layer on the at least one graphene layer and remove a portion of the silicon oxide layer on a lower surface.
Figure 12:
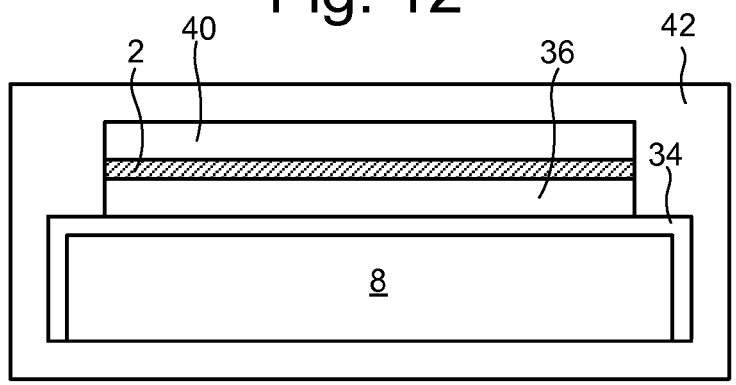
FIG. 12 is a schematic side sectional view of the arrangement of FIG. 11 after further processing to form an encapsulation layer or sacrificial layer.

In an alternative embodiment, schematically depicted in FIGS. 11 and 12, the step of forming the second graphene-support layer 38 is omitted. In this case the further layer 40 is formed directly on the at least one graphene layer 2, as shown in FIG. 11. FIG. 12 shows the result of applying the encapsulation layer or sacrificial layer 42.

FIGS. 13-17 depict example subsequent processing stages starting from the arrangement of FIG. 10. The same processing could also be carried out starting from the arrangement of FIG. 12.

Figure 13:
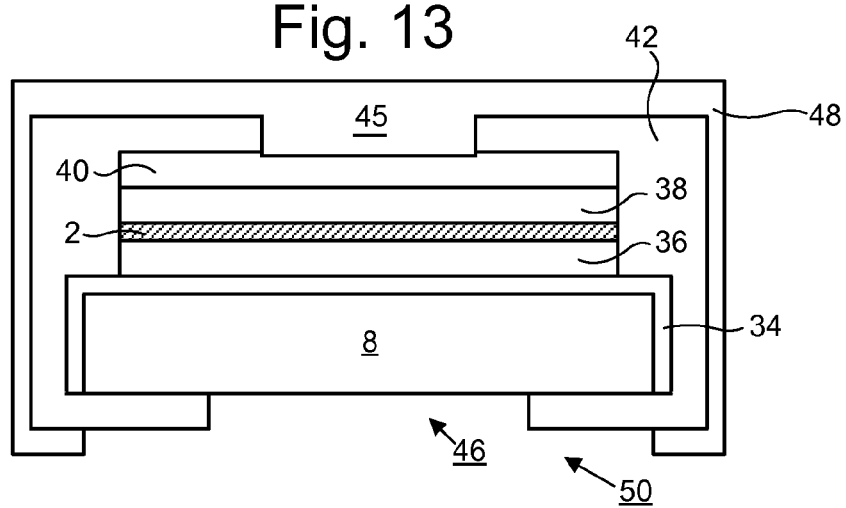
FIG. 13 is a schematic side sectional view of the arrangement of FIG. 10 after photolithographic formation of windows in the encapsulation layer or sacrificial layer and deposition of a further encapsulation layer or sacrificial layer.

To achieve the arrangement shown in FIG. 13, the arrangement of FIG. 10 is photolithographically patterned and then processed to form windows 45 and 46 in the encapsulation layer or sacrificial layer 42 (e.g. by dry etching in $Si_xN_y$). A further encapsulation layer or sacrificial layer 48 is then deposited around the resulting arrangement and processed (e.g. by dry etching or selective deposition) to open window 50. The further encapsulation layer or sacrificial layer 48 may comprise a poly(p-xylylene) polymer such as Parylene or ProTEK® type materials for example.

Figure 14:
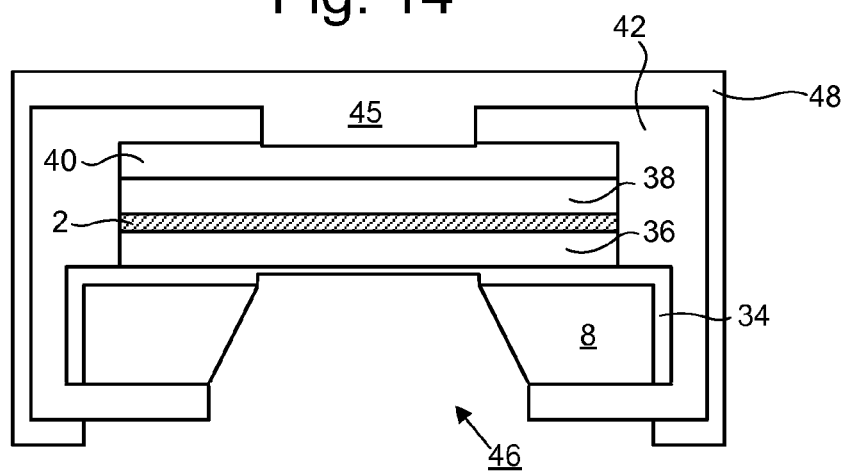
FIG. 14 is a schematic side sectional view of the arrangement of FIG. 13 after further processing to etch away a portion of the base layer.

In a subsequent step a KOH etch is used to remove the silicon forming the base layer 8, thereby producing the arrangement shown in FIG. 14. The presence of the further encapsulation layer or sacrificial layer 48 during this processing provides mechanical strength to facilitate handling and also acts to protect layers which are not being etched (e.g preventing damage to the at least one graphene layer 2 itself or damage to a quality of adhesion between the at least one graphene 2 and other layers).

Figure 15:
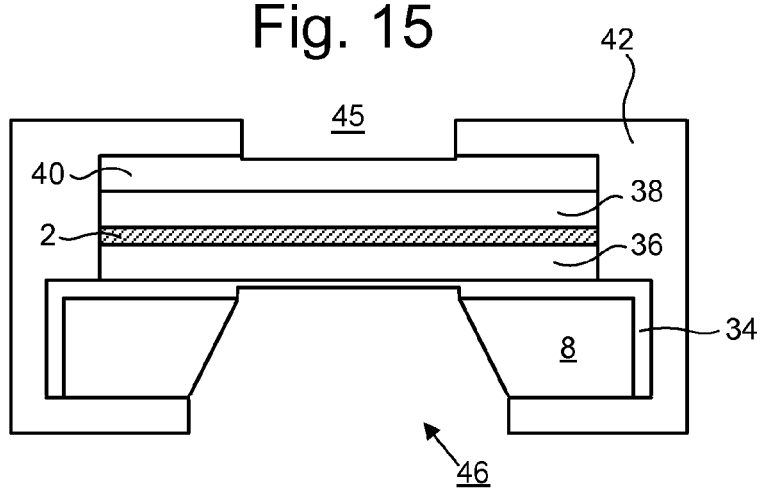
FIG. 15 is a schematic side sectional view of the arrangement of FIG. 14 after further processing to remove the further encapsulation layer or sacrificial layer.

In a subsequent step the further encapsulation layer or sacrificial layer 48 is removed to produce the arrangement shown in FIG. 15. In an embodiment the further encapsulation layer or sacrificial layer 48 is removed using an $O_2$ barrel etch, Rie etch or other removal techniques.

Figure 16:
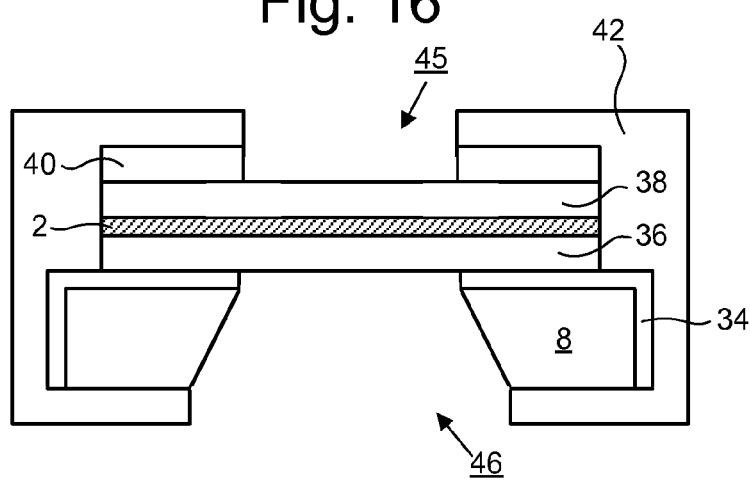
FIG. 16 is a schematic side sectional view of the arrangement of FIG. 15 after further processing to remove a portion of the further layer.
Figure 17:
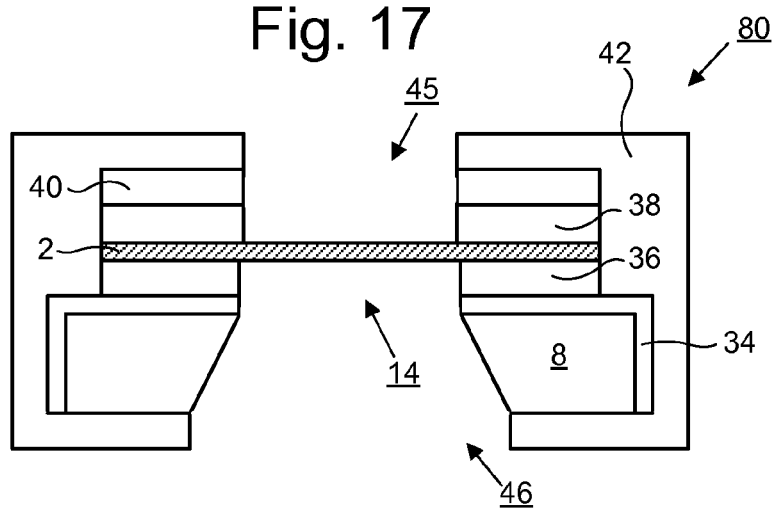
FIG. 17 is a schematic side sectional view of the arrangement of FIG. 16 after further processing to remove portions of the first and second graphene-support layers and thereby form a freestanding membrane.

In a subsequent step a portion of the further layer 40 within window 45 and a portion of the silicon oxide layer 34 in window 46 are removed to produce the arrangement shown in FIG. 16. In an embodiment these layers are removed using a buffered oxide etch. In a subsequent step portions of the first and second graphene-support layers 36 and 38 are removed (via windows 45 and 46) to leave a freestanding membrane 14, as shown in FIG. 17. In an embodiment, the first and second graphene-support layers 36 and 38 are removed using a metal etch.

Figure 18:
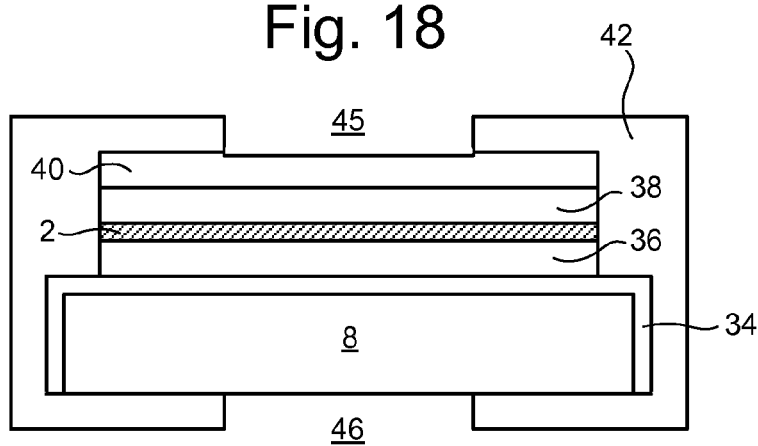
FIG. 18 is a schematic side sectional view of the arrangement of FIG. 10 after further processing according to an alternative embodiment in which a further encapsulation layer or sacrificial layer is not used, the further processing comprising photolithographic formation of windows in the encapsulation layer or sacrificial layer.
Figure 19:
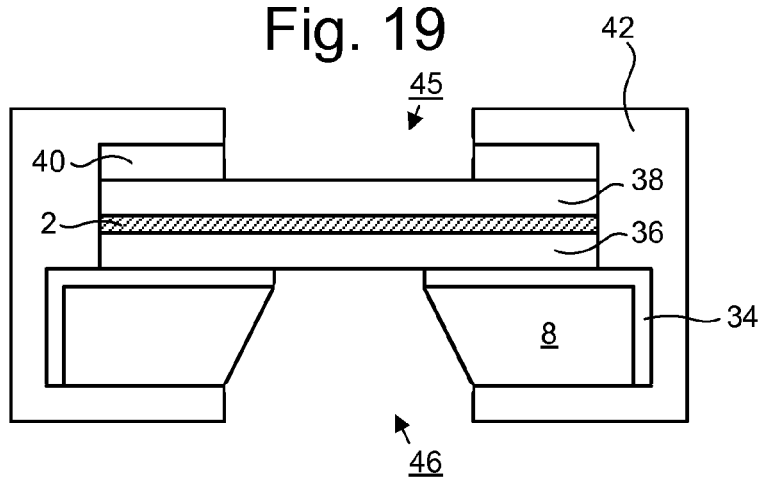
FIG. 19 is a schematic side sectional view of the arrangement of FIG. 18 after further processing to remove a portion of the further layer.
Figure 20:
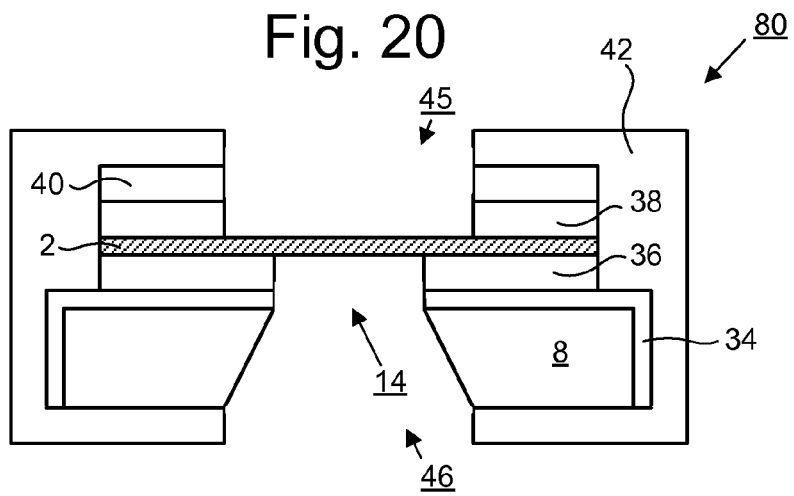
FIG. 20 is a schematic side sectional view of the arrangement of FIG. 19 after further processing to remove portions of the first and second graphene-support layers and thereby form a freestanding membrane.

FIGS. 18-20 depict alternative subsequent processing stages starting from the arrangement of FIG. 10. The same processing could also be carried out starting from the arrangement of FIG. 12. The processing of FIGS. 18-20 does not require the further encapsulation layer or sacrificial layer 48 (as used in the processing described above with reference to FIGS. 13-17). In the case where the further encapsulation layer or sacrificial layer 48 comprises Parylene, the processing which does not use this layer may be referred to as a Parylene-free processing flow.

To produce the arrangement shown in FIG. 18, the arrangement of FIG. 10 is photolithographically patterned and then processed to form windows 45 and 46 in the encapsulation layer or sacrificial layer 42 (e.g. by dry etching in $Si_xN_y$).

In a subsequent step a buffered oxide etch is used to remove a portion of the further layer 40 in window 45. A KOH etch is used to remove a portion of the silicon forming the base layer 8 within window 46, thereby producing the arrangement of FIG. 19.

In a subsequent step portions of the first and second graphene-support layers 36 and 38 in windows 45 and 46 are removed to leave a freestanding membrane 14, as shown in FIG. 20. In an embodiment, the portions of the first and second graphene-support layers 36 and 38 are removed using a suitable etch.

The methods described above with reference to FIGS. 13-20 are example embodiments in which a stack comprising the at least one graphene layer 2 is encapsulated with an encapsulation layer or sacrificial layer 42 over at least a front and a side surface of the stack during the removing of the first substrate portion 11. In the particular examples shown, the stack comprises the base layer 8, the silicon oxide layer 34, the first graphene-support layer 36, the at least one graphene layer 2 and the further layer 40 when starting from the arrangement of FIG. 12. When starting from the arrangement of FIG. 10, the stack further comprises the second graphene-support layer 38. The first substrate portion 11 comprises the portions of the base layer 8, silicon oxide layer 34 and first graphene-support layer 36 which are removed in order to form the freestanding membrane 14, as shown for example in FIGS. 17 and 20. The encapsulation layer or sacrificial layer 42 protects the at least one graphene layer 2 from damage during the processing steps used to remove the first substrate portion 11 and form the freestanding membrane 14. The layers provided above the at least one graphene layer 2 may also enhance mechanical rigidity of the stack, thereby facilitating safe handling of the stack during processing to remove the first substrate portion 11.

Figure 21:
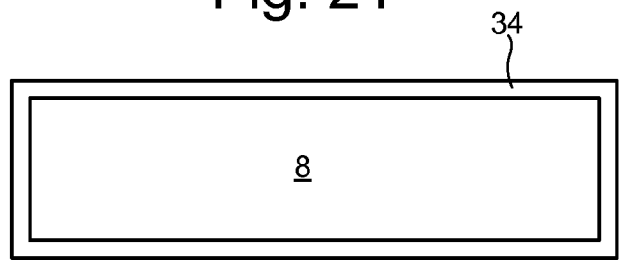
FIG. 21 is a schematic side sectional view of a silicon base layer after processing to form a silicon oxide layer, for use in an alternative embodiment.

FIGS. 21-28 depict stages in an alternative embodiment. In this embodiment, a base layer 8 comprising a silicon wafer is processed to form a silicon oxide layer 34 ($SiO_2$) on an outer surface of the silicon wafer (FIG. 21). In a subsequent step a lower side of the stack is etched to remove the silicon oxide layer 34 on the lower side of the base layer 8. In a subsequent step an encapsulation layer or sacrificial layer 42 is applied to produce the arrangement shown in FIG. 22. The encapsulation layer or sacrificial layer 42 in this embodiment may comprise for example a PECVD nitride etch mask.

Figure 22:
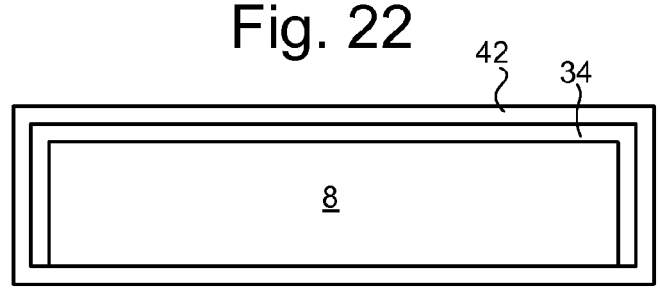
FIG. 22 is a schematic side sectional view of the arrangement of FIG. 21 after processing to remove a portion of the silicon oxide layer on a lower surface and apply an encapsulation layer or sacrificial layer.
Figure 23:
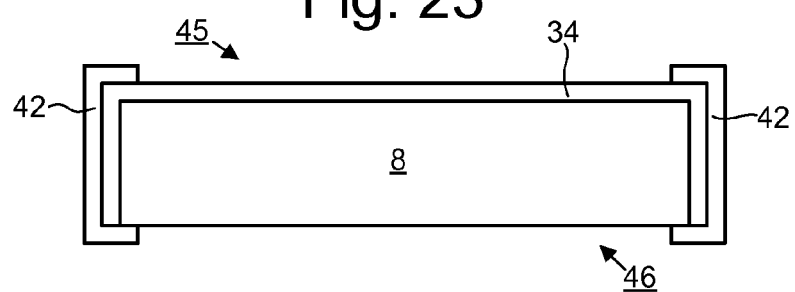
FIG. 23 is a schematic side sectional view of the arrangement of FIG. 22 after photolithographic processing to form windows in the encapsulation layer or sacrificial layer.
Figure 24:
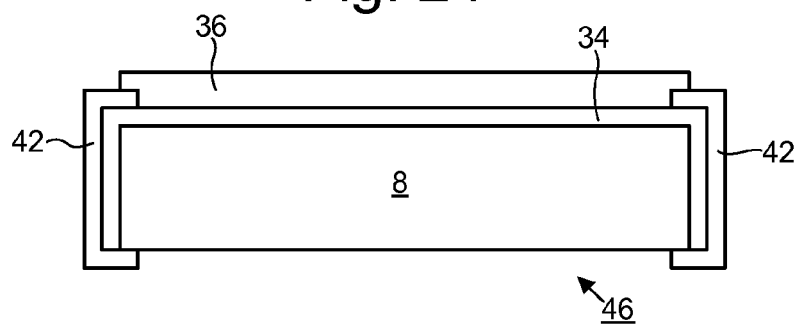
FIG. 24 is a schematic side sectional view of the arrangement of FIG. 23 after processing to apply a graphene-support layer.

In a subsequent step the arrangement of FIG. 22 is photolithographically patterned and then processed to form windows 45 and 46 in the encapsulation layer or sacrificial layer 42 (e.g. by $Si_xN_y$ dry/wet etch), as shown in FIG. 23.

In a subsequent step a graphene-support layer 36 is formed that fills window 45. The graphene-support layer 36 may take any of the forms described above (e.g. comprising a metal or metal silicide).

Figure 25:
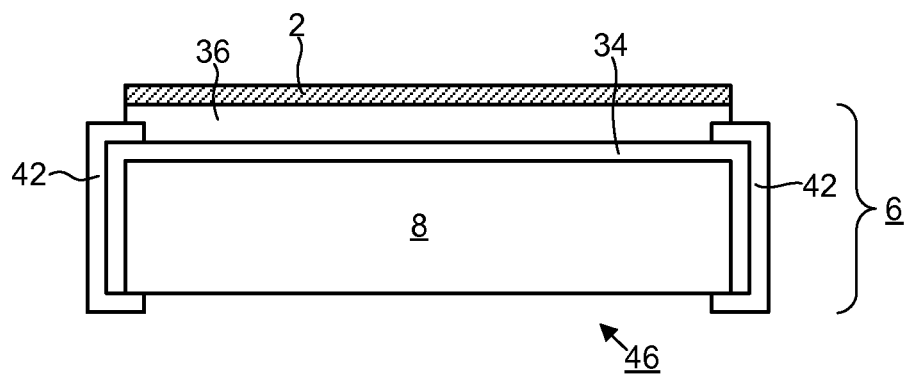
FIG. 25 is a schematic side sectional view of the arrangement of FIG. 24 after processing to deposit at least one graphene layer.

In a subsequent step the at least one graphene layer 2 is formed on the graphene-support layer 36 to produce the arrangement shown in FIG. 25. The at least one graphene layer 2 may take any of the forms described above (e.g. formed using CVD).

Figure 26:
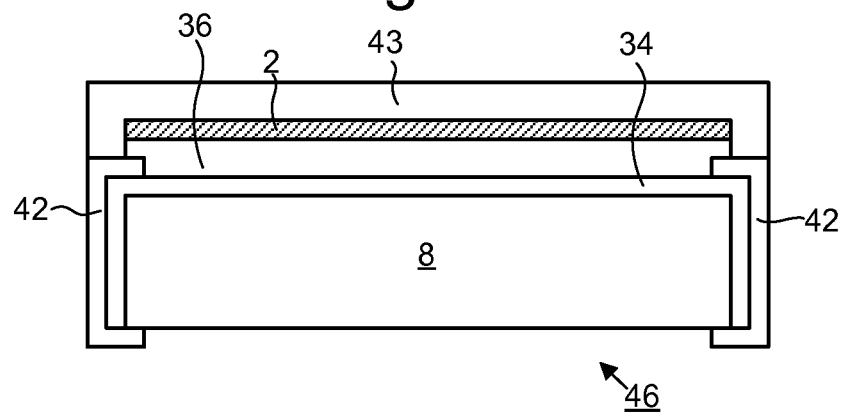
FIG. 26 is a schematic side sectional view of the arrangement of FIG. 25 after processing to deposit a protection layer.

In a subsequent step a protection layer 43 is applied over the at least one graphene layer 2 to produce the arrangement shown in FIG. 26. In an embodiment the protection layer 43 comprises PMMA or another organic material. PMMA can be applied (e.g. by spin coating) with minimum risk of disruption or damage to previously deposited layers (e.g. the at least one graphene-layer 2 or any other layers). PMMA is known to be compatible with graphene and various techniques are known for removing PMMA effectively without damaging graphene layers.

Figure 27:
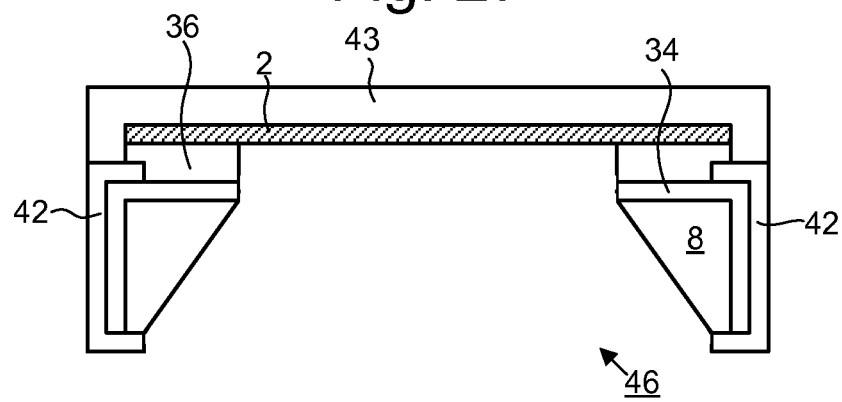
FIG. 27 is a schematic side sectional view of the arrangement of FIG. 26 after processing to remove a portion of the base layer, silicon oxide and graphene-support layer beneath the at least one graphene layer.

In a subsequent step a portion of the base layer 8, silicon oxide layer 34 and graphene-support layer 36 in window 46 are removed in a region beneath the at least one graphene layer 2 to produce the arrangement shown in FIG. 27. In an embodiment the removal is implemented using a dry/wet etch of $Si_xN_y$ following by a KOH etch.

Figure 28:
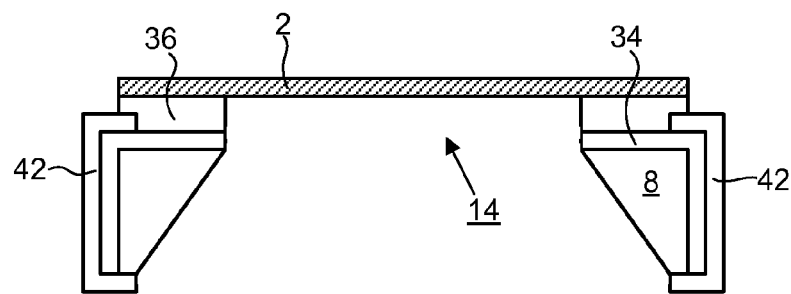
FIG. 28 is a schematic side sectional view of the arrangement of FIG. 27 after processing to remove the protection layer and thereby form a freestanding membrane.

In a subsequent step the protection layer 43 above the at least one graphene layer 2 is removed to leave a freestanding membrane 14, as shown in FIG. 28. In an embodiment the protection layer 43 is removed by thermal decomposition or by liquid/vapor solvation.

In an embodiment a control layer 44 is provided over a portion of the at least one graphene layer 2 outside of the freestanding membrane 14. The control layer 44 can be used to control a tension in the freestanding membrane 14. For example, in an embodiment the control layer 44 is processed (e.g. by heating or cooling) to cause a change in an internal structure of the control layer 44. The change in the internal structure transfers forces to the freestanding membrane, thereby causing a change in tension in the freestanding membrane 14. The change in the internal structure may be such as to persist after the processing (e.g. by heating or cooling) has stopped. In an embodiment, the control layer 44 is deposited on the at least one graphene layer 2 in such a way that the density of the layer is lower than an equilibrium bulk density. Subjecting such a layer to an external influence (e.g. by applying heat) can cause the layer to shrink so as to bring the density closer to the bulk density. This shrinking is an example of a change in the internal structure of the control layer 44 which would be effective in changing a tension in the freestanding membrane 14 (e.g. increasing the tension as the control layer 44 shrinks). In other embodiments the control layer 44 may be processed to change the tension in the freestanding membrane 14 by causing the control layer 44 to undergo a phase transition, by thinning the control layer 44, for example by dry or wet etching, or by changing a chemical composition of the control layer 44.

In an embodiment the tension in the freestanding membrane 14 is controlled so that the freestanding membrane 14 will remain sufficiently flat during use. If the tension in the freestanding membrane 14 is too low, the freestanding membrane 14 may be undesirably flappy, leading to excessive sagging, or wrinkled. Wrinkling may lead to non-uniform thickness of the freestanding membrane 14. A freestanding membrane 14 that is loose or of non-uniform thickness can have poorer imaging properties. If the tension in the freestanding membrane 14 is too high, the freestanding membrane 14 can be brittle and more susceptible to breaking. Accordingly, it is desirable to control the tension in the freestanding membrane 14 to be within a target range at the manufacturing stage.

In an embodiment the tension in the freestanding membrane 14 is controlled at the manufacturing stage so that heat transferred to the freestanding membrane 14 during use (e.g. due to heating by absorption of lithography radiation) does not cause buckling or other deformation or breakage of the freestanding membrane 14.

In an embodiment, the tension is controlled at the manufacturing stage so that expected heating of the freestanding membrane 14 during use leads to the tension in the freestanding membrane 14 reaching a desired range of values. For example, in the case where the heating in use raises the tension in the freestanding membrane 14, the tension may be controlled at the manufacturing stage to be lower than the desired range of values by an amount which is such that the expected level of heating will cause the tension to rise to a value within the desired range of values.

In an embodiment, a method of manufacturing a pellicle 80 is provided which is particularly well adapted for providing a pellicle 80 with a control layer 44 for controlling a tension in the freestanding membrane 14. FIGS. 29-36 schematically depict stages in an example of such an embodiment.

Figure 29:
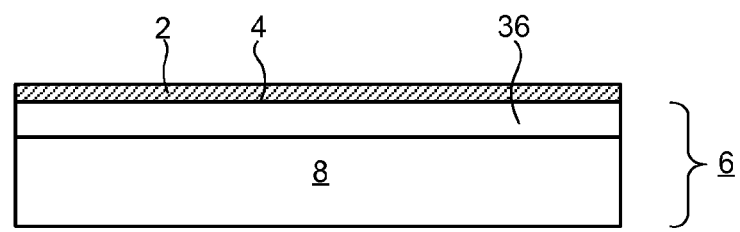
FIG. 29 is a schematic side sectional view of a stack comprising a base layer, graphene-support layer and at least one graphene layer, for use in an alternative embodiment.

In this embodiment a substrate 6 is provided which has a base layer 8 and a graphene-support layer 36. The at least one graphene layer 2 is formed on the graphene-support layer 36. FIG. 29 schematically depicts such an arrangement. The graphene-support layer 36 and base layer 8 may be formed according to any of the embodiments discussed above. The graphene-support layer 36 may comprise for example a metal layer or a metal silicide layer. The base layer 8 may comprise for example a silicon wafer. The at least one graphene layer 2 may be formed according to any of the embodiments discussed above. The at least one graphene layer 2 may be formed using CVD for example.

Figure 30:
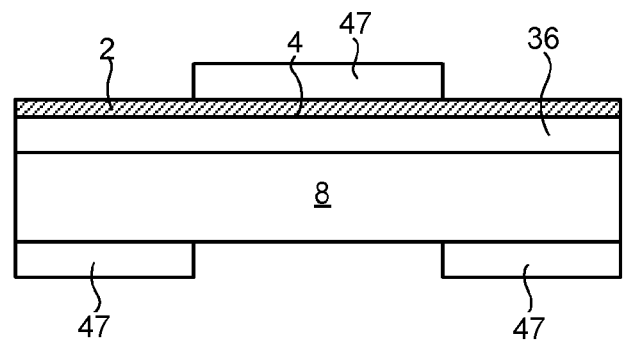
FIG. 30 is a schematic side sectional view of the arrangement of FIG. 29 after photolithographic processing to form mask layers on upper and lower surfaces of the stack.
Figure 31:
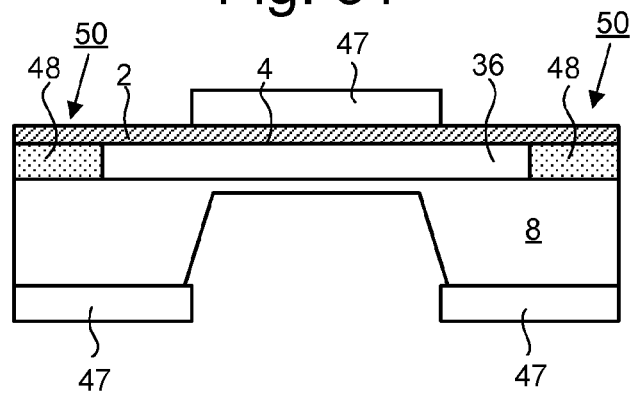
FIG. 31 is a schematic side sectional view of the arrangement of FIG. 30 after processing to partially etch a region of the base layer that is not protected by a mask layer.
Figure 32:
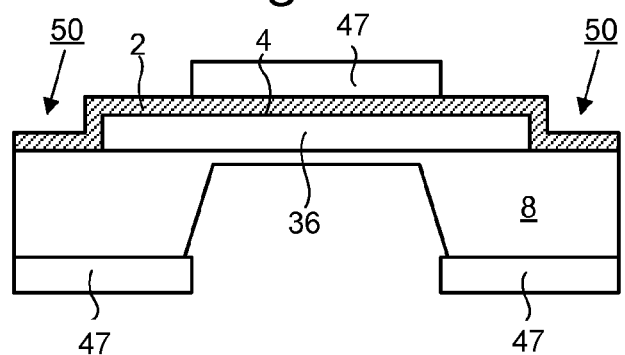
FIG. 32 is a schematic side sectional view of the arrangement of FIG. 31 after processing to remove a first portion of a graphene-support layer.

The method comprises removing a first portion 48 of the graphene-support layer 36 without removing a portion 50 of the at least one graphene layer 2 that was deposited on the first portion 48 of the graphene-support layer 36. FIGS. 30-32 schematically depict one way in which this may be achieved.

As shown in FIG. 30, mask layers 47 are deposited on the front and back of the stack. The mask layers 47 are processed photolithographically so that the mask layers 47 cover selected regions on the front and back of the stack. In an embodiment, the selected region on the front of the stack contains the region in which the freestanding membrane 14 is to be formed, when viewed perpendicularly to the planar surface 4 of the substrate 6. The selected region on the back of the stack is outside of the region in which the freestanding membrane 14 is to be formed, when viewed perpendicularly to the planar surface 4 of the substrate 6.

In a subsequent step a region of the base layer 8 that is not protected by the mask layer 47 on the back of the stack is partially etched to produce the arrangement shown in FIG. 31. In the case where the base layer 8 is formed from a silicon wafer a KOH etch may be used.

In a subsequent step a side etch (which may also be referred to as an undercut) is carried out to remove the first portion 48 of the graphene-support layer 36. The first portion 48 to be removed is indicated in FIG. 31 by shading. The arrangement after removal is shown in FIG. 32. After removal of the first portion 48 the previously overlying portion 50 of the at least one graphene layer 2 falls downwards and adheres to the previously underlying base layer 8.

Figure 33:
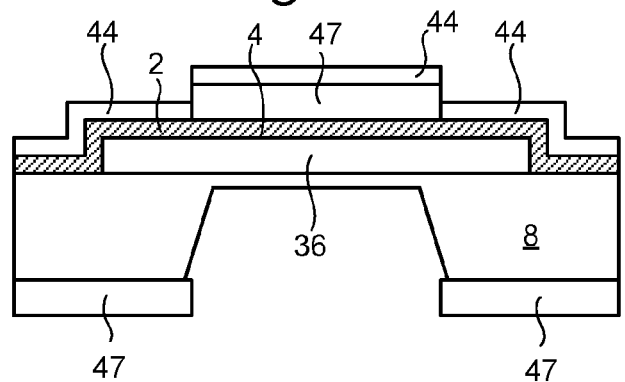
FIG. 33 is a schematic side sectional view of the arrangement of FIG. 32 after processing to deposit a control layer.
Figure 34:
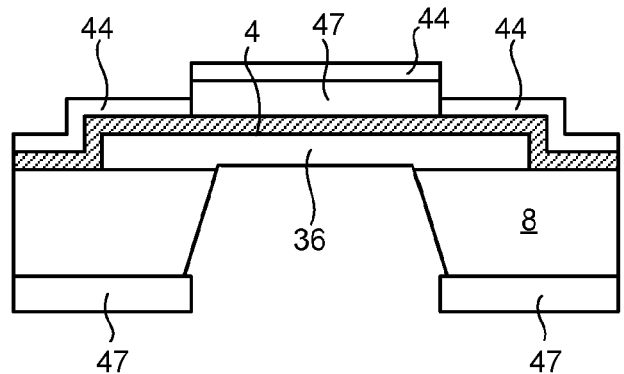
FIG. 34 is a schematic side sectional view of the arrangement of FIG. 33 after processing to complete etching of the base layer to penetrate through to the graphene-support layer.

The method further comprises depositing a control layer 44 above the at least one graphene layer 2. An example of the resulting arrangement is shown in FIG. 33. The control layer 44 may be deposited for example using sputtering or evaporation (e.g. e-beam evaporation). In a subsequent step etching of the base layer 8 (e.g. using KOH etch) from the back of the stack is continued in order to penetrate through to the graphene-support layer 36, thereby arriving at the arrangement shown in FIG. 34.

Figure 35:
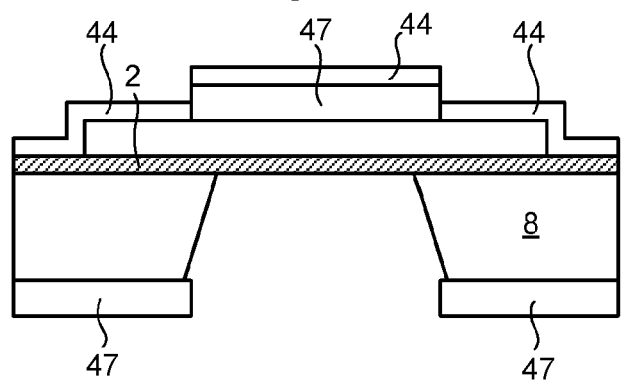
FIG. 35 is a schematic side sectional view of the arrangement of FIG. 34 after processing to remove a second portion of the graphene-support layer.

The method further comprises removing a second portion of the graphene-support layer 36. The removal of the second portion of the graphene-support layer 36 causes weakening or removal of adhesion between the at least one graphene layer 2 and layers which were positioned above the second portion of the graphene-support layer 36 (immediately prior to the removal of the second portion of the graphene-support layer 36). FIG. 35 schematically depicts example processing. In this particular example the second portion of the graphene-support layer 36 consists of all of the remaining graphene-support layer 36. Removal of the second portion of the graphene-support layer 36 therefore leads to complete removal of the graphene-support layer 36 in this embodiment.

Figure 36:
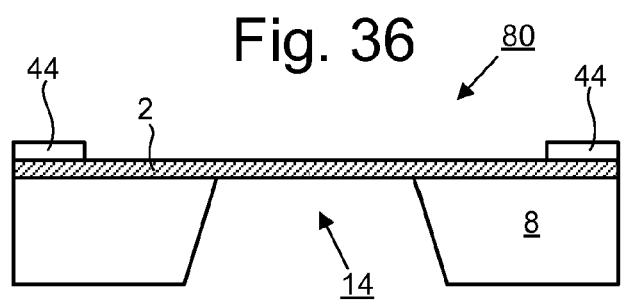
FIG. 36 is a schematic side sectional view of the arrangement of FIG. 35 after processing to lift off layers above the previous location of the second portion of the graphene-support layer, thereby forming a freestanding membrane.
Figure 37:
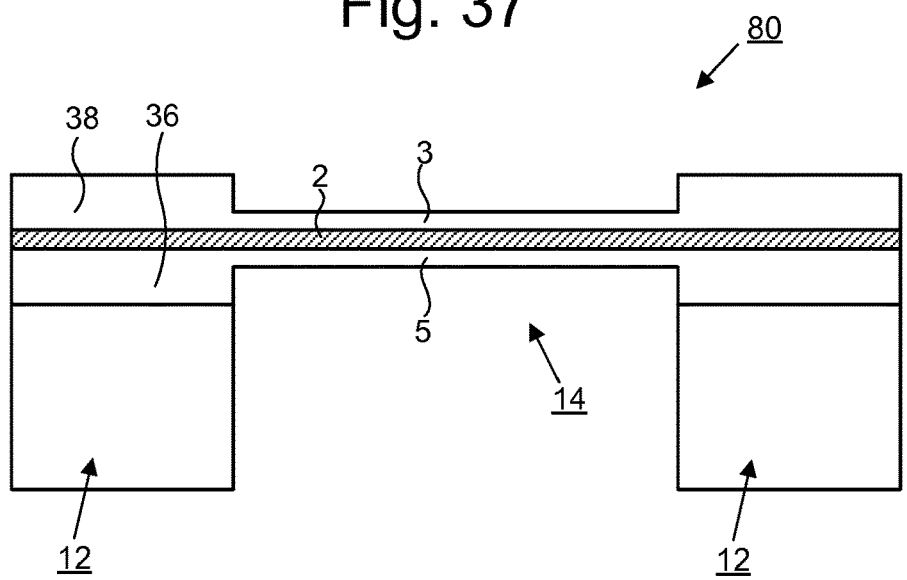
FIG. 37 is a schematic side sectional view of pellicle having a freestanding membrane comprising at least one graphene layer, an additional layer on an upper surface and an additional layer on a lower surface.

The method further comprises lifting off the layers which were positioned above the second portion of the graphene-support layer 36, thereby forming the freestanding membrane 14 as shown in FIG. 36.

In an embodiment, the removing of either or both of the first portion 48 of the graphene-support layer 36 and the second portion of the graphene-support layer 36 is performed using side etching.

Figure 42:
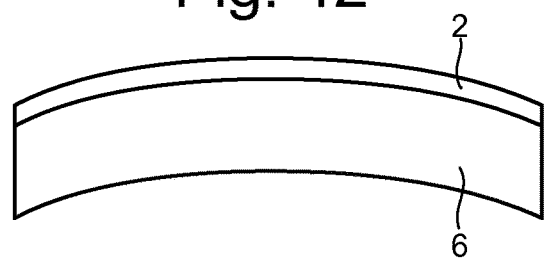
FIG. 42 depicts applying tensile forces to an at least one graphene layer formed on a substrate by deforming the substrate.
Figure 43:
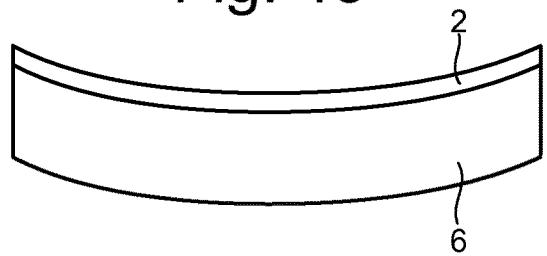
FIG. 43 depicts applying compressive forces to an at least one graphene layer formed on a substrate by deforming the substrate.

In an embodiment, a tension in the freestanding membrane 14 is controlled during manufacture of the pellicle by processing the substrate 6 on which the at least one graphene layer 2 is initially deposited. The processing of the substrate 6 may be performed prior to or after removal of the first substrate portion 11. In an embodiment the processing of the substrate 6 comprises deforming the planar surface of the substrate 6 on which the at least one graphene layer 2 is initially formed. Example deformations are depicted schematically in FIGS. 42 and 43. In FIG. 42, the substrate 6 has been processed to cause the substrate 6 to bow outwards on the side of the substrate 6 on which the at least one graphene layer 2 has been deposited. This applies a tensile force to the at least one graphene layer 2. In FIG. 43, the substrate 6 has been processed to cause the substrate 6 to bow inwards on the side of the substrate 6 on which the at least one graphene layer 2 has been deposited. This applies a compressive force to the at least one graphene layer 2. The deformation of the substrate 6 may be performed in various ways. In one embodiment, the deformation is achieved by applying heating or cooling non-uniformly to the substrate 6. The non-uniform heating or cooling causes a corresponding non-uniform thermal expansion or contraction, which can deform the substrate 2.

When a pellicle comprising graphene is used in an EUV lithography apparatus, EUV photons, oxygen, hydrogen and/or water present near the pellicle can create defects in the graphene lattice. Defects may also be present due to intrinsic limitations in the processes used to deposit the graphene (e.g. CVD processes). Damage or intrinsic defects may reduce the mechanical robustness of the graphene and thereby increase the chance of pellicle failure. Defect free graphene is more robust against damage induced by EUV photons, oxygen, hydrogen and/or water. Undesirable etching away of carbon from the graphene will occur preferentially at defect sites. Reducing the number of defects will therefore reduce the extent and/or rate of undesirable etching. Reducing undesirable etching will help the pellicle maintain its transmissive properties and lateral imaging uniformity longer.

Amorphous carbon deposition is inherent to the use of EUV. This process is normally unwanted for pellicles because carbon reduces the pellicle transmission. However, for pellicles having a freestanding membrane comprising one or more layers of graphene, deposition of amorphous carbon on the pellicle surface can be used to repair inherently present defects or defects induced by EUV photons, oxygen, hydrogen and/or water. Conversion of amorphous carbon to graphene can be i) thermally activated, ii) catalytically activated, or iii) achieved by applying shear forces. Embodiments exploiting (i) and (ii) are described below.

In an embodiment, thermal activation is used. This approach may be particularly applicable for example where a freestanding membrane comprises at least one graphene layer and no capping layer. The temperature of a pellicle being used in a lithographic apparatus will depend on the particular operating parameters of the lithographic apparatus. Typically, it is expected that temperatures between about 500K and 800K will be reached in normal use for a 1000 W source power. Such pellicle temperatures will only increase upon increasing source power if the thickness of the pellicle is not reduced concomitantly. For thermal activation of conversion of amorphous carbon to graphene pellicle temperatures of greater than 800K are preferred.

In an embodiment, a device manufacturing method is provided in which a pellicle 80 comprising at least one graphene layer 2 forming a freestanding membrane 14 is used to protect a patterning device MA. An electrical current is passed through the at least one graphene layer 2 to heat the at least one graphene layer 2. The heating thermally activates conversion of amorphous carbon to single- or multilayer graphene, thereby effecting repair of defects or damage present in the at least one graphene layer 2. The pellicle 80 is thereby at least partially repaired in-situ, improving average performance and longevity of the pellicle 80.

In an embodiment, the at least one graphene layer 2 is heated to above 800K, optionally above 850K, optionally above 900K, optionally above 1000K.

In an embodiment, a flow of material comprising a source of carbon may be provided onto the pellicle 80. The flow may comprise one or both of the following: a flow of evaporated carbon (e.g. amorphous carbon); and a flow of a carbon based precursor gas. The carbon based precursor gas is a gas acting as a source of carbon (e.g. amorphous carbon). The carbon based precursor gas may comprise one or more of the following for example: methane ($CH_4$) or acetylene ($C_2H_2$). Providing a flow of material comprising a source of carbon makes it possible to control the supply of carbon. Controlling the supply of carbon may be desirable for example to ensure uniformity of the repair process and/or to avoid excessive deposition of carbon (which may impair transmissivity through the pellicle). The flow of material may be applied during heating of the freestanding membrane. The provision of carbon is not limited to the above example methods. Carbon may be provided in any form.

Figure 41:
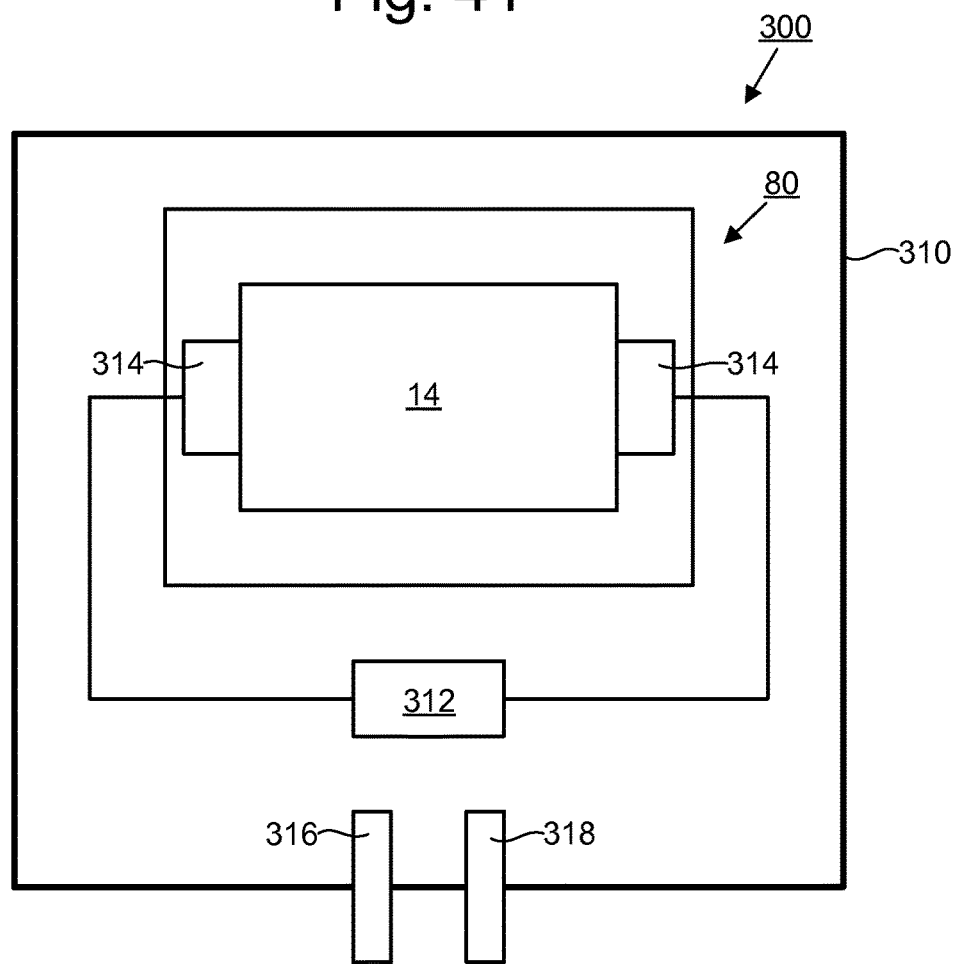
FIG. 41 depicts an apparatus for processing a pellicle.

In an embodiment, the pellicle 80 is provided with two or more conductive contact regions 314 positioned to allow an electrical current to be driven through the freestanding membrane 14 via the two or more conductive contact regions 314. The two or more conductive contact regions 314 may be formed in direct contact with the at least one graphene layer 2. An example of a pellicle 80 provided with conductive contact regions 314 is depicted in FIG. 41 in the case where the pellicle 80 is repaired offline. However, the pellicle 80 may also be configured in this manner for allowing heating to be applied while the pellicle 80 is in-situ within the lithography apparatus (e.g. protecting an optical element of the lithography apparatus, such as a patterning device). Fabrication of conductive (e.g. metallic) contact regions can easily be integrated into the fabrication process (e.g. where fabrication is CMOS/MEMS based).

Figure 46:
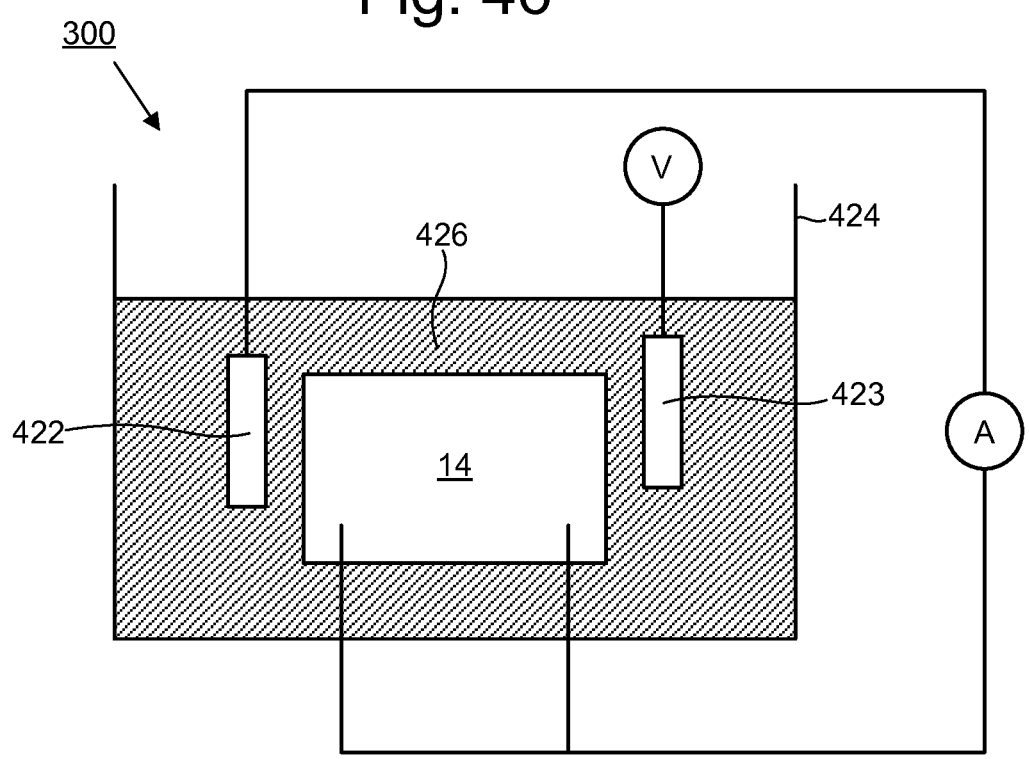
FIG. 46 depicts an electrochemical cell for processing a pellicle.
Figure 47:
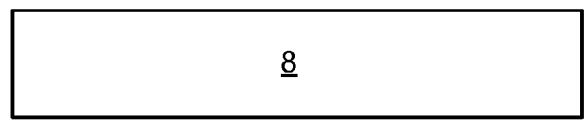
FIGS. 47-52 depicts an example process flow in which a stack is provided with a graphene-support layer after formation of an encapsulation layer or sacrificial layer.

In an embodiment, examples of which are shown in FIGS. 41 and 46, an apparatus 300 for processing (e.g. repairing) a pellicle 80 is provided. The apparatus 300 may be configured to operate offline or inline. When used offline, the apparatus 300 may be used to repair intrinsic defects in the at least one graphene layer before the pellicle 80 is first used in the lithographic apparatus. Alternatively or additionally, the apparatus 300 may be used to repair pellicles 80 after they have been damaged during use in the lithographic apparatus. The pellicle 80 comprises at least one graphene layer 2 forming a freestanding membrane 14. The pellicle 80 may take any of the various forms disclosed elsewhere in this application, for example. The pellicle 80 may be obtainable or obtained by any of the methods disclosed in this application for example.

In an embodiment, as shown in FIG. 41, the apparatus 300 comprises a current driving apparatus 312 for driving an electrical current through the freestanding membrane 14 to heat the freestanding membrane (and therefore also the at least one graphene layer 2 in the freestanding membrane 14). The current driving apparatus 312 may comprise a power source of any type suitable for driving the required electrical current through the freestanding membrane 14. The current driving apparatus 312 may comprise suitable leads and/or electrical connectors for connecting to the conductive contact regions 314.

In an embodiment, the apparatus 300 comprises one or more supply ports 316, 318 for applying a flow of material comprising a source of carbon (e.g. amorphous carbon) onto the pellicle 80. The apparatus 300 may comprise suitable containers for storing the material comprising the source of carbon. Where the source of carbon comprises evaporated carbon, apparatus for evaporating carbon may be provided.

In an embodiment, the apparatus 300 further comprising an enclosure 310 for containing the pellicle 80 during repair of the pellicle 80. The one or more supply ports 316, 318 may, in such an embodiment, convey the flow of material comprising the source of carbon from the outside of the enclosure 310 to the inside of the enclosure 310.

In an embodiment, as shown in FIG. 46, the apparatus 300 is configured to use electrochemical deposition to apply carbon to the at least one graphene layer 2. This may be achieved using an electrochemical cell. In the electrochemical cell the freestanding membrane 14 is immersed in a bath 424 containing a solution 426 of an electrolyte and/or carbon precursor. The freestanding membrane 14 acts as a working electrode. When an electrochemical potential is applied, a redox reaction on the surface of the freestanding membrane 14 will take place. The organic precursor forms carbon (by reduction or oxidation) and the carbon deposits on the surface of the freestanding membrane 14. The freestanding membrane 14 is thus processed (e.g. repaired) as desired.

Many suitable configurations of electrochemical cell are available. In the example shown in FIG. 46, the apparatus 300 comprises an electrochemical cell having three-electrodes: the freestanding membrane 14 (as a working electrode), a counter-electrode 422, and a reference electrode 423. The principle of operation of three-electrode electrochemical cells are well known in the art. Other types of electrochemical cell (e.g. two-electrode or four-electrode) may also be used.

Details for performing electrochemical carbon deposition in a general context may be found in the literature. These techniques may be used to process a pellicle according to the present method. Examples are given below.

In Surface and Coatings Technology 124 (2000) 196-200, Q. Fu et al. disclose use of various organic solvents as carbon precursor and investigated the influence of the carbon precursor (DMF, $CH_3CN$ etc.) on the $sp^2/sp^3$ carbon ratio in the films obtained by electrodeposition on indium tin oxide.

In Journal of The Electrochemical Society, 155 5 E49-E55 2008, Sadoway et al. disclose the electrochemical growth of diamond-like carbon (DLC) coatings on substrates.

In many of the described techniques for electrochemical carbon deposition relatively large positive potentials are used (for example, in the region of 1000V), but there are also described techniques in which deposition is performed at lower voltages and at room temperature. In ACS Nano, 2016, 10 (1), pp 1539-1545, Kim et al. show that the current density at the defect sites and grain boundaries is higher thus enabling selective electrochemical deposition on these sites.

In J. Mater. Chem., 2008, 18, 3071-3083, Burghard et al. showed that carbon nanotubes can be decorated with polymers obtained electrochemically. In Small 2011, 7, 1203-1206, Liu et al. disclose that graphene can be obtained electrochemically from graphene oxide.

In US 2013/0098768 A1 an alternative method is described. Graphite is suspended in a solvent and doped with a Lewis or Brönsted acid to make the graphite sheets positively charged. A negative potential is then applied on a substrate so that the doped graphite migrates to the surface of the substrate forming graphene. The method is suitable for many kinds of substrates. In an embodiment the freestanding membrane 14 is used as the substrate. The method is thus used to deposit carbon on the at least one graphene layer 2 of the freestanding membrane 14.

In ACS Nano 2012, 6, 205-211, Z. Yang et al. disclose that doping of graphene with atoms with a lower electronegativity than carbon such as boron (B) can provide a distribution of positive charge on the graphene surface. In an embodiment, such doping is applied to graphene and a negative potential is applied to a freestanding membrane 14 to cause graphite from the graphene to migrate to the surface of the freestanding membrane 14.

In an embodiment, a catalytically active metal which promotes the conversion of carbon to single- or multilayer graphene is provided within or in contact with the at least one graphene layer 2 of the pellicle 80. The catalytic metal can be provided in any form, including for example one or more of the following: atoms, molecules, nanoparticles, vapor, or thin film. The catalytic metal can be provided at any stage of the manufacturing process. When present during use of the pellicle 80 or during processing to repair the pellicle 80 after use, the catalytically active metal may enable desirable conversion of carbon to single- or multilayer graphene to occur efficiently at lower temperatures than would be possible without the catalytically active metal. In an embodiment, the catalytically active metal is provided before or during the deposition of the at least one graphene layer 2. The catalytically active metal may in this case improve the quality of the at least one graphene layer 2. The catalytically active metal may reduce the number of defects present in the at least one graphene layer 2. The catalytically active metal may be provided as a vapor. In this case, the requirement to etch away a metal film provided instead of the metal vapor, during manufacture of the pellicle 80, may desirably be avoided. Alternatively or additionally, the use of a metal vapor instead of a metal film may improve the quality of the at least one graphene layer 2 by allowing improved optimization of grain sizes and/or surface morphology because graphene does not generally adhere conformally to a metal surface. In an embodiment the at least one graphene layer 2 is grown on a dielectric surface while catalytic activation is provided by a metal vapor. Optionally, the dielectric substrate is seeded prior to growth of the at least one graphene layer 2. The seeding may be performed, for example, by deposition of a small exfoliated graphene flake on the dielectric.

Figure 38:
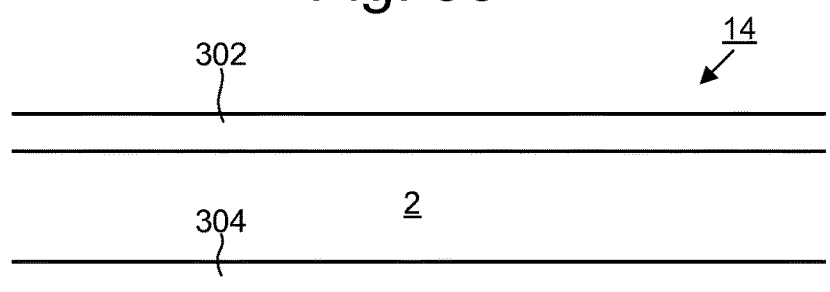
FIG. 38 is a schematic side sectional view of a portion of an at least one graphene layer with a layer of catalytically active metal on a top surface and on a bottom surface of the at least one graphene layer.

In an embodiment, the catalytically active metal comprises a transition metal. In an embodiment, the catalytically active metal comprises one or more of Fe, Co, Ni, and Cu, but other materials could be used In an embodiment, an example of which is depicted schematically in FIG. 38, the catalytically active metal is provided via formation of a layer 302,304 of the catalytically active metal on one or both sides of the at least one graphene layer 2. In the particular example shown, the layer 302,304 is provided on both sides but this is not essential. The layer may be provided on the top side only or on the bottom side only.

Figure 39:
FIG. 39 is a schematic side sectional view of a portion of an at least one graphene layer with an internal layer of catalytically active metal.

Alternatively or additionally, in an embodiment, an example of which is depicted schematically in FIG. 39, the catalytically active metal is provided via formation of a layer 306 of the catalytically active metal within the at least one graphene layer 2.

Figure 40:
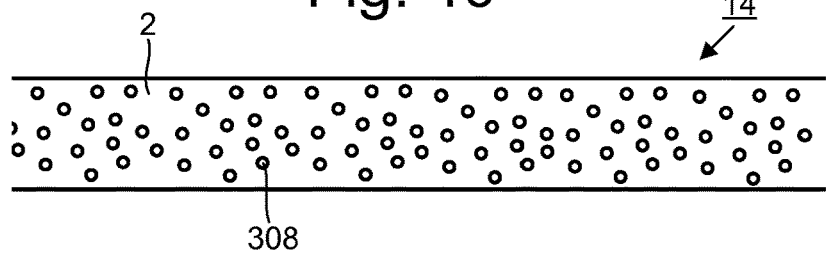
FIG. 40 is a schematic side sectional view of a portion of an at least one graphene layer with nanoparticles or dopant atoms of catalytically active metal.

Alternatively or additionally, in an embodiment, an example of which is depicted schematically in FIG. 40, the catalytically active metal is provided via inclusion of nanoparticles 308 of the catalytically active metal within the at least one graphene layer 2.

Alternatively or additionally, in an embodiment, the catalytically active metal is provided via doping of the graphene in the at least one graphene layer by atoms of the catalytically active metal.

In an embodiment, the catalytically active metal is provided by performing the depositing (e.g. by CVD) of the at least one graphene layer 2 in the presence of a vapor of the catalytically active metal.

In an embodiment, an example of which is depicted schematically in FIG. 44, the freestanding membrane 14 is formed with a capping layer 402,404 on either or both sides of the at least one graphene layer 2. In the particular example shown in FIG. 44, the capping layer 402,404 is provided on both sides of the at least one graphene layer 2. The capping layer 402,404 protects the at least one graphene layer 2 from chemical attack by radical species such as hydrogen, oxygen and hydroxyl radical species. Such radical species are likely to be present during scanning conditions and may cause degradation of the freestanding membrane 14 in the absence of the capping layer 402,404. The inventors have performed experiments demonstrating for example the effects of exposure of graphite to a flux of hydrogen (H*) radicals. After 28 hours exposure in a hydrogen radical generator the number of holes seen in secondary electron images (SEM) was significantly greater than prior to the exposure.

In an embodiment the capping layer 402,404 comprises a metal or a metal oxide. Capping layers 402,404 formed from metal or metal oxide have been found to be particularly effective at protecting graphene. In an embodiment, the capping layer comprises one or more material selected from the following group: Ru, Mo, B, $MoSi_2$, h-BN (hexagonal boron nitride), $HfO_2$, $ZrO_2$, $Y_2O_3$, $Nb_2O_5$, $La_2O_3$, and $Al_2O_3$. The metals Ru and Mo, the compounds $MoSi_2$ and h-BN, and the metal oxides $HfO_2$, $ZrO_2$, $Y_2O_3$, $Nb_2O_5$, $La_2O_3$, and $Al_2O_3$ have been found to be particularly effective as capping layers 402,404. Other high-k dielectric materials could also be used.

The capping layers 402,404 can be deposited using a variety of techniques, including for example physical vapor deposition (PVD), chemical vapor deposition (CVD), evaporation, or atomic layer deposition (ALD). The capping layers 402,404 should be relatively thin (of nanometer order) in order to minimize EUV transmission losses. The inventors have found that ALD is particularly effective for producing layers which are very thin and yet still fully closed.

In an embodiment, an example of which is shown in FIG. 45, adhesion between the capping layer 402,404 and the at least one graphene layer 2 is improved by providing an adhesion layer 412,414 between the capping layer 402,404 and the at least one graphene layer 2. In the absence of any adhesion layer, adhesion between graphene and materials coated on the graphene can be poor. It is possible to improve adhesion by creating hydrophilic —OH groups on the surface. Hydrophilic —OH groups on the surface allow good adhesion of oxides for example. It has been found however that creating hydrophilic —OH groups on the surface can compromise the electronic stability of graphene by disrupting the $sp^2$ bonded network. Compromising the electronic stability can cause atomic sites to be created which act is starting points for further defect generation.

In an embodiment the adhesion layer 412,414 is configured to reduce or avoid compromising of the electronic stability of the graphene. In an embodiment, the adhesion layer 412,414 comprises a material having $sp^2$-bonded carbon and hydrophilic groups. The presence of the $sp^2$-bonded carbon reduces or avoids compromising of the electronic stability of the graphene. The presence of the hydrophilic groups promotes good adhesion. In an embodiment the adhesion layer 412,414 comprises amorphous carbon (a-C). In an embodiment the amorphous carbon is partly oxidized. Partly oxidized amorphous carbon is expected to possess both $sp^2$-bonded carbon and hydrophilic groups such as $C_n$—OH or $C_n$—COOH.

In embodiments described above a graphene-support layer 36 is provided. The graphene-support layer comprises one or more of the following: transition metals such as Mo, Ni, Ru, Pt, Cu, Ti, V, Zr, Nb, Hf, Ta, W, or their silicides, such as silicized Mo, silicized Ni, silicized Ru, silicized Pt, silicized Cu, silicized Ti, silicized V, silicized Zr, silicized Nb, silicized Hf, silicized Ta, silicized W. Due to the risk of contamination of processing apparatus, it is undesirable for some of these materials to be present when certain high temperature processing steps are being carried out. For example, it is undesirable for Mo or silicized Mo to be present during a low pressure chemical vapor deposition (LPCVD) process, which may typically be performed at around 800 degrees C. It has been found that such an LPCVD process can be used to form particularly effective encapsulation or sacrificial layers 42 of $Si_xN_y$. PECVD may also be used to form an encapsulation layer or sacrificial layer 42 of $Si_xN_y$, but it has been found that pinholes in the encapsulation layer or sacrificial layer 42 can allow etchants (e.g. KOH) in subsequent wet etching steps to pass through the encapsulation layer or sacrificial layer 42. It has further been found that adhesion to the at least one graphene layer 2 is poor, which limits the extent to which processing steps can be carried out after the at least one graphene layer 2 has been formed. It has further been found that stresses in the graphene-support layer 36, particularly when comprising Mo or silicized Mo, can be changed by processing at high temperatures. Control of stresses in the graphene-support layer 36 is therefore made more complex by each high temperature processing step that is carried out while the graphene-support layer 36 is present. Process flows in which the above problems are avoided or reduced are described below with reference to FIGS. 47-67. In each process flow, a stack is provided in which a graphene-support layer 36 is formed after an encapsulation layer or sacrificial layer 42 is formed. Three alternative process flows are depicted respectively in FIGS. 47-52, 53-56 and 57-60. Each process flow starts from a silicon wafer (with its native oxide) and produces a multi-layer structure in which a patterned encapsulation layer or sacrificial layer 42 is formed using LPCVD before a graphene-support layer 36 is formed and before the at least one graphene layer 2 is formed.

Figure 48:
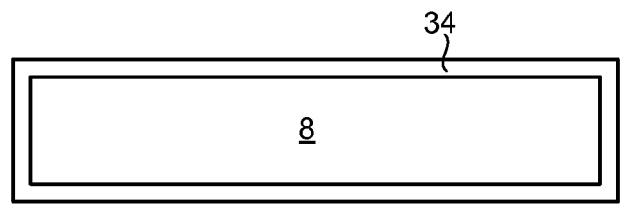
Figure 49:
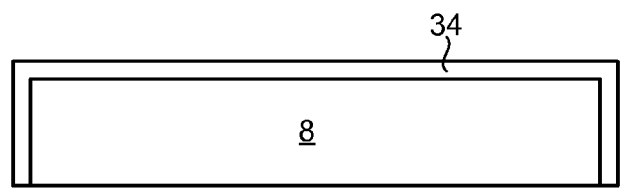
Figure 50:
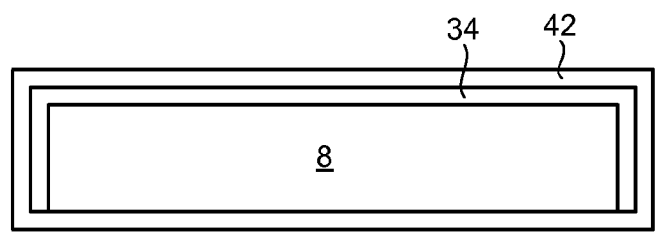
Figure 51:
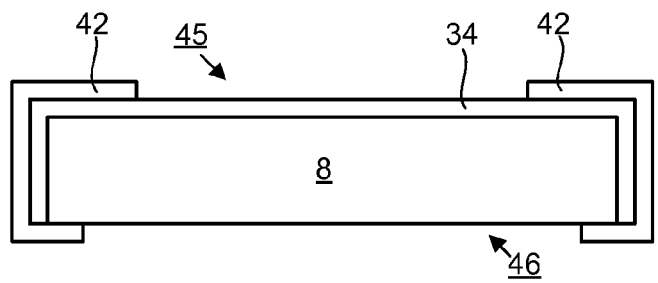

In the process flow of FIGS. 47-52, a base layer 8 comprising a silicon wafer (FIG. 47) is processed to form a silicon oxide layer 34 ($SiO_2$) on an outer surface of the silicon wafer (FIG. 48). The silicon oxide layer 34 may be formed using thermal oxidation at about 1000 degrees C., for example. In a subsequent step a lower side of the stack is etched to remove the silicon oxide layer 34 on the lower side of the base layer 8 (FIG. 49). In a subsequent step an encapsulation layer or sacrificial layer 42 is applied to produce the arrangement shown in FIG. 50. The encapsulation layer or sacrificial layer 42 in this embodiment comprises an LPCVD $Si_xN_y$ layer (deposited at around 800 degrees C. for example). In a subsequent step the arrangement of FIG. 50 is photolithographically patterned and then processed to form windows 45 and 46 in the encapsulation layer or sacrificial layer 42 (e.g. by RIE), as shown in FIG. 51. In a subsequent step a graphene-support layer 36 is formed that fills window 45. The graphene-support layer 36 may take any of the forms described above (e.g. comprising a metal or metal silicide, for example Mo or silicized Mo). In an embodiment the graphene-support layer 36 comprises Mo deposited using CVD at 20 degrees C. (or at a higher temperature, for example any temperature between room temperature and about 1000 degrees C.).

Figure 54:
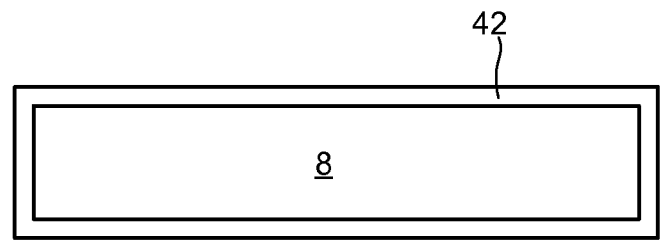
Figure 55:
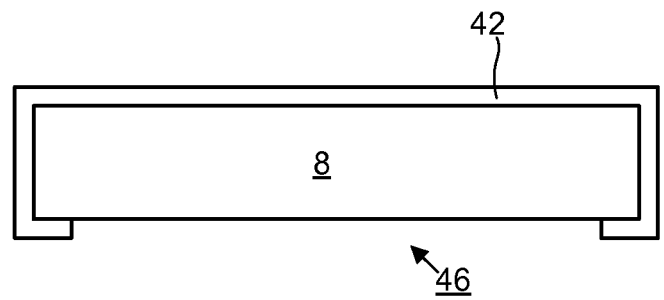
Figure 56:
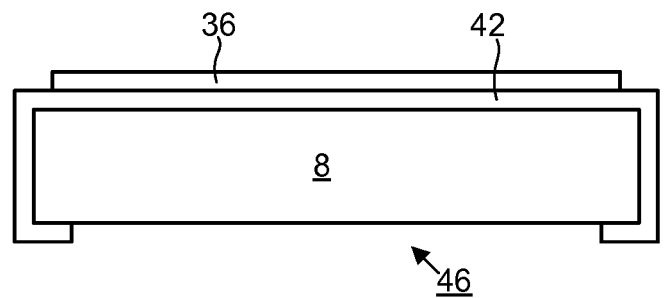
Figure 57:
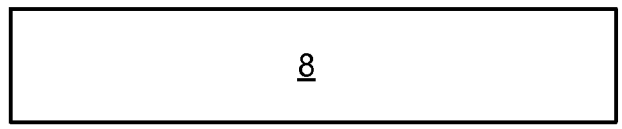
FIGS. 57-60 depict a further alternative example process flow in which a stack is provided with a graphene-support layer after formation of an encapsulation layer or sacrificial layer.

In the process flow of FIGS. 53-56, a base layer 8 comprising a silicon wafer (FIG. 53) is processed to apply an encapsulation layer or sacrificial layer 42 around the base layer 8 (FIG. 54). The encapsulation layer or sacrificial layer 42 in this embodiment comprises an LPCVD $Si_xN_y$ layer (deposited at around 800 degrees C. for example). In a subsequent step the arrangement of FIG. 54 is photolithographically patterned and then processed to form a window 46 in the encapsulation layer or sacrificial layer 42 (e.g. by RIE), as shown in FIG. 55. In a subsequent step a graphene-support layer 36 is formed on an upper side of the stack to provide the arrangement shown in FIG. 56. The graphene-support layer 36 may take any of the forms described above (e.g. comprising a metal or metal silicide, for example Mo or silicized Mo). In an embodiment the graphene-support layer 36 comprises Mo deposited using CVD at 20 degrees C. (or at a higher temperature, for example any temperature between room temperature and about 1000 degrees C.).

Figure 58:
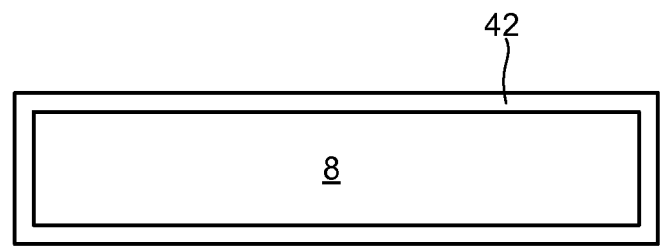
Figure 59:
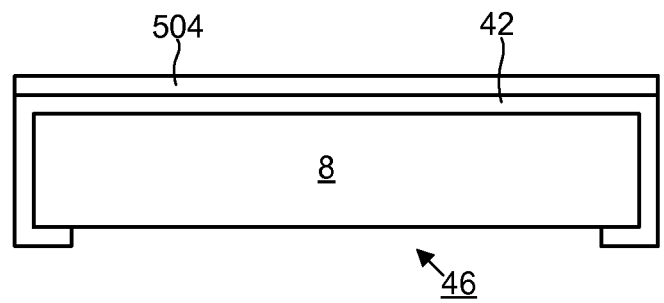
Figure 60:
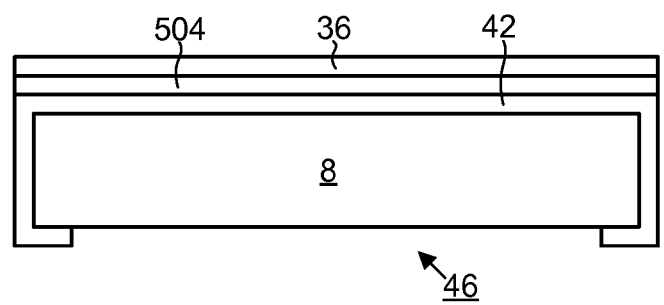

In the process flow of FIGS. 57-60, a base layer 8 comprising a silicon wafer (FIG. 57) is processed to apply an encapsulation layer or sacrificial layer 42 around the base layer 8 (FIG. 58). The encapsulation layer or sacrificial layer 42 in this embodiment comprises an LPCVD $Si_xN_y$ layer (deposited at around 800 degrees C. for example). In a subsequent step the arrangement of FIG. 58 is photolithographically patterned and then processed to form a window 46 in the encapsulation layer or sacrificial layer 42 (e.g. by RIE). A TEOS layer 504 is then formed on an upper side of the stack, using PECVD or LPCVD at 400 degrees C. for example, to provide the arrangement shown in FIG. 59. In a subsequent step a graphene-support layer 36 is formed on an upper side of the stack to provide the arrangement shown in FIG. 60. The graphene-support layer 36 may take any of the forms described above (e.g. comprising a metal or metal silicide, for example Mo or silicized Mo). In an embodiment the graphene-support layer 36 comprises Mo deposited using CVD at 20 degrees C. (or at a higher temperature, for example any temperature between room temperature and about 1000 degrees C.).

FIGS. 61-67 depict an example process flow to be performed subsequently to a process flow (such as the process flow of FIGS. 47-52, the process flow of FIG. 53-56, or the process flow of FIGS. 57-60) that has provided the graphene-support layer 36 after forming an encapsulation layer or sacrificial layer 42 at an earlier stage using a high temperature LPCVD process (e.g. to form an LPCVD $Si_xN_y$ layer at around 800 degrees C.).

Figure 52:
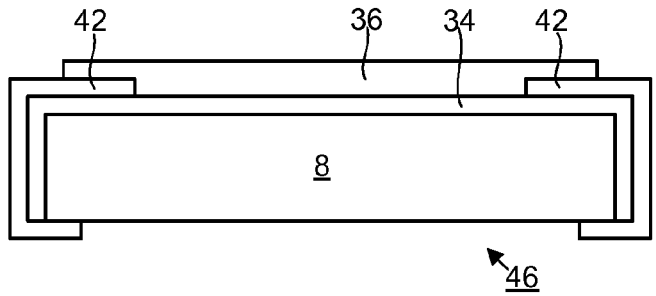
Figure 53:
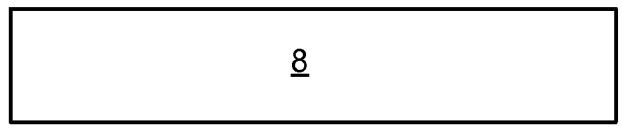
FIGS. 53-56 depict an alternative example process flow in which a stack is provided with a graphene-support layer after formation of an encapsulation layer or sacrificial layer.
Figure 61:
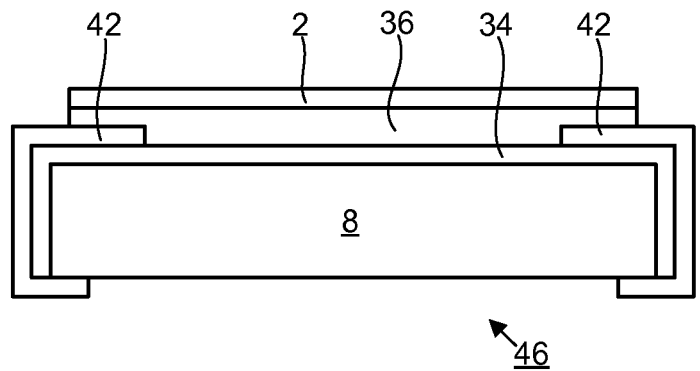
FIGS. 61-67 depict an example process flow continuing from the process flow shown in FIGS. 47-52 and leading to formation of a freestanding membrane.
Figure 62:
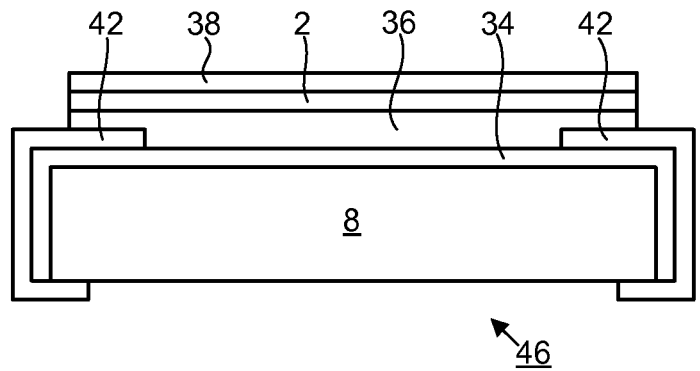
Figure 63:
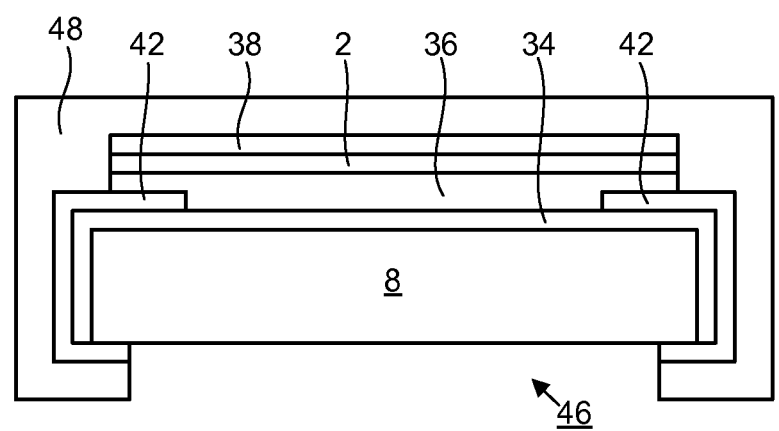

In the particular example of FIGS. 61-67 the process flow starts from the arrangement of FIG. 52. The arrangement of FIG. 52 is processed to form the at least one graphene layer 2 on an upper surface of the graphene-support layer 36 (FIG. 61). The at least one graphene layer 2 may take any of the forms described above (e.g. formed using CVD at a temperature of 900-1000 degrees C.). In a subsequent step, a further graphene-support layer 38 is formed on the at least one graphene layer 2 to produce the arrangement shown in FIG. 62. In an embodiment the further graphene-support layer 38 has the same composition as the graphene-support layer 36 and is formed using the same methods. In an embodiment, both the graphene-support layer 36 and the further graphene-support layer 38 comprise Mo deposited using CVD at 20 degrees C. (or at a higher temperature, for example any temperature between room temperature and about 1000 degrees C.). In a subsequent step the stack is encapsulated by a further encapsulation layer or sacrificial layer 48 to produce the arrangement shown in FIG. 63. In an embodiment the further encapsulation layer or sacrificial layer 48 comprises Parylene deposited using CVD.

Figure 64:
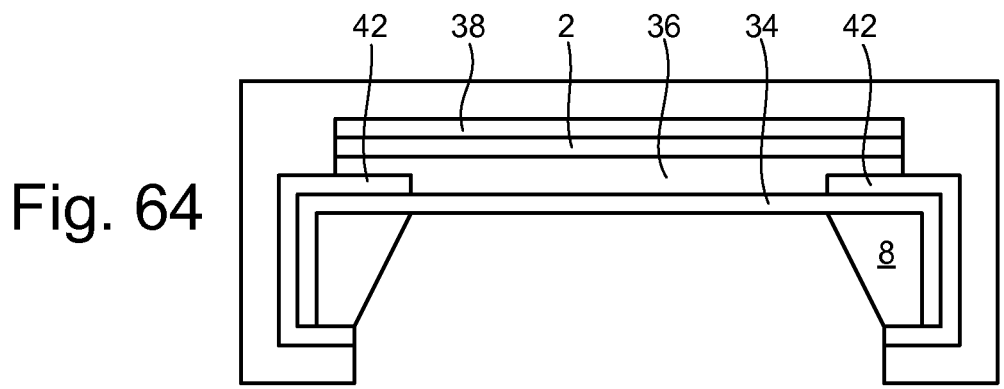
Figure 65:
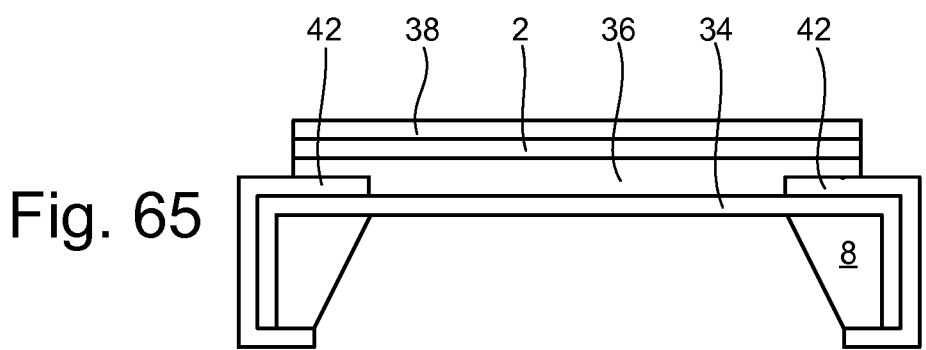
Figure 66:
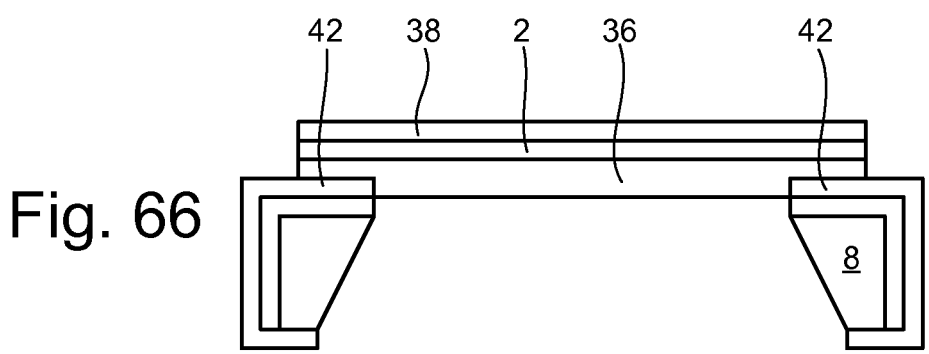
Figure 67:
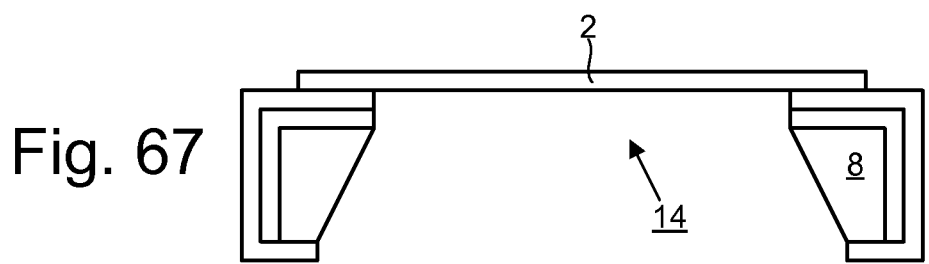
Figure 68:
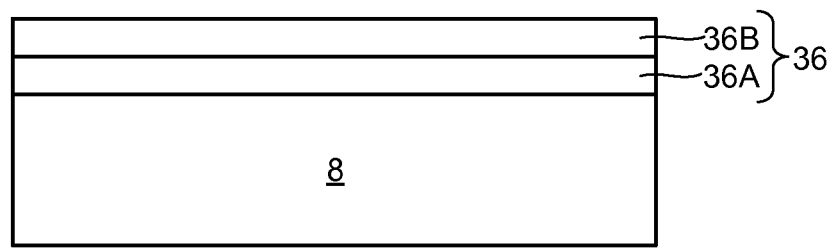
FIG. 68 depicts a graphene-support layer comprising a Mo layer and a silicized Mo layer.

In a subsequent step, a KOH etch (or partial etching by deep RIE followed by a KOH etch) is used to remove a portion of the silicon forming the base layer 8 within window 46, thereby producing the arrangement of FIG. 64. In a subsequent step, the further encapsulation layer or sacrificial layer 48 is removed (e.g. in barrel etcher by $O_2$ microwave plasma) to produce the arrangement of FIG. 65. In a subsequent step an oxide etch (e.g. BHF) is applied to the lower side of the stack to remove an exposed portion of the silicon oxide layer 34 underneath the graphene-support layer 36 (FIG. 66). Finally, the graphene-support layer 36 and the further graphene-support layer 38 are removed (e.g. using a wet $H_2O_2$ etch or a vapor etching process), to leave a freestanding membrane 14, as shown in FIG. 67.

In the embodiments described above with reference to FIGS. 47-68, a stress in the encapsulation layer or sacrificial layer 42, in the graphene-support layer 36 and/or in the further graphene-support layer 38, may be tuned during deposition, from tensile to compressive or from compressive to tensile, in order to control a stress in the freestanding membrane 14.

In embodiments where the at least one graphene layer 2 is formed on a graphene-support layer 36, the removing of the first substrate portion 11 to form the freestanding membrane 14 will comprise removing a portion of the graphene-support layer 36 underneath a portion of the at least one graphene layer 2 that is to form the freestanding membrane 14. Removal of such a portion of the graphene-support layer 36 is described above with reference to the transitions between FIGS. 16 and 17, between FIGS. 19 and 20, between FIGS. 26 and 27, between FIGS. 34 and 35, and between FIGS. 66 and 67. It is possible to remove the portion of the graphene-support layer 36 using a wet etch. For example, Mo can be removed using a wet etch comprising hydrogen peroxide in water. The inventors have found, however, that wet etching can cause damage to the freestanding membrane 14 and reduce yield. The inventors have found that yield can be increased by using a vapor etching process instead of a wet etching process. The improvement in yield is believed to be due to a reduction or removal of capillary force effects, concentration gradient effects and Brownian motion effects, relative to wet etching. Reduction or removal of capillary force effects, concentration gradient effects and Brownian motion effects also facilitates upscaling of the method of manufacturing a pellicle to larger size pellicles.

Figure 69:
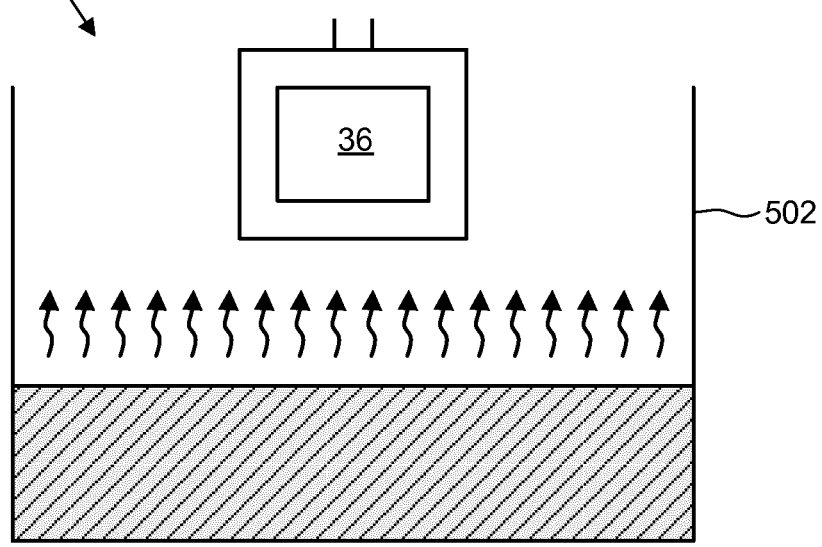
FIG. 69 depicts vapor etching of a graphene-support layer.

Example apparatus 500 for removing a portion of a graphene-support layer 36 using a vapor etching process is depicted in FIG. 69. In this example, a reservoir 502 containing a liquid to be vaporized (e.g. water) is heated to produce vapor (e.g. steam). A stack (such as is depicted in any of FIGS. 16, 19, 34 and 66) is positioned so that a portion of a graphene-support layer 36 is exposed to the vapor. The vapor is chosen so that the exposed portion of the graphene-support layer 36 is removed by vapor etching. The inventors have found this approach to be particularly applicable where the graphene-support layer 36 comprises Mo or silicized Mo (e.g. $MoSi_2$) and the vapor comprises steam.

The above-described methods of manufacture, and other methods of manufacture, provide a pellicle 80 comprising a membrane bonded to a membrane support. In the context of the methods discussed above the membrane support is referred to as a second substrate portion 12. In those methods the second substrate portion 12 is manufactured by removing a first substrate portion 11 from a substrate. However, it is not essential that the membrane support be formed in this way.

The membrane comprises a graphene layer (e.g. at least one graphene layer 2, as described above). The membrane is bonding to and created on the membrane support with a thin film deposition process. The thin film deposition process may comprise chemical vapor deposition or another thin film deposition process. The bond between the membrane and the membrane support is an intrinsic bond between the membrane and the membrane support induced by the thin film deposition process of the membrane layer onto the membrane support. The bond may be an intrinsic bond between the graphene layer and the membrane support induced by a thin film deposition process of the graphene layer onto the membrane support. The intrinsic bonding has a bonding strength such that the membrane remains bonded to the membrane support under a gravity force acting on a membrane, optionally for all orientations of the pellicle relative to the direction of gravity.

Figure 70:
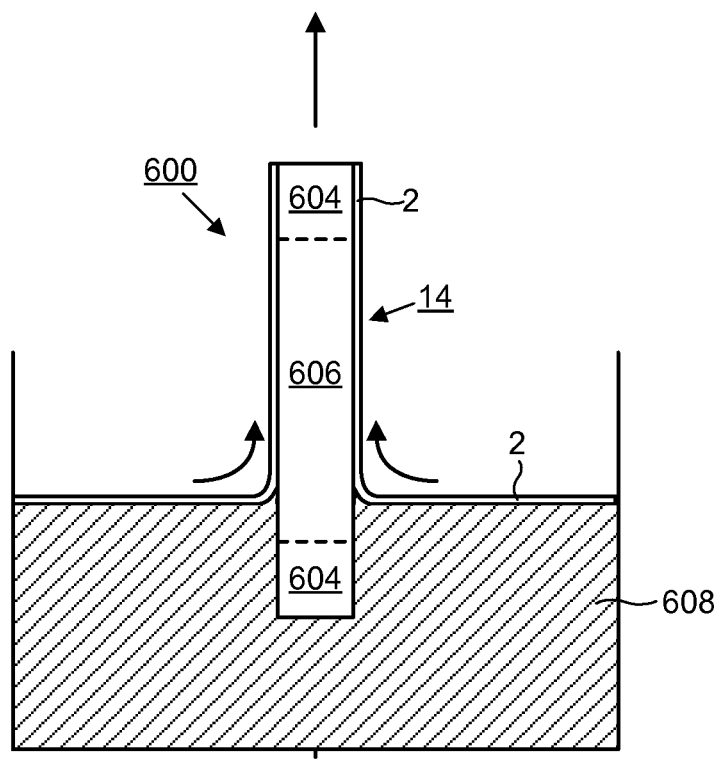
FIG. 70 depicts transfer of at least one graphene layer from the surface of a liquid onto a frame.

In an alternative embodiment, as depicted schematically in FIG. 70, a pellicle for a lithographic apparatus is manufactured by transferring at least one graphene layer 2 from a surface of a liquid 608 onto a frame 600. The frame 600 comprises an opening 606 and a border region 604 surrounding the opening 606. In FIG. 70, the frame 600 is shown from the side so the opening 604 is not directly visible. A boundary of the opening 604 is depicted by broken lines. The opening 604 comprises a hole penetrating through from the right of the frame 600 to the left of the frame 600 in the orientation shown in FIG. 70. After transfer to the frame 600, the at least one graphene layer 2 spans the opening 606, thereby forming a freestanding membrane 14. In the embodiment shown in FIG. 70 the frame 600 is dipped into the liquid 608 in a direction perpendicular to the surface of the liquid 608 (i.e. vertically in the orientation shown) and then removed. Capillary and adhesion forces drag the at least one graphene layer 2 onto the frame 600. Other arrangements are however possible. It is challenging to produce large freestanding membranes 14 with high yield. Due to the high aspect ratio of the freestanding membrane, surface tension and capillary force effects can cause tearing or rupturing of the freestanding membrane 14. It is also difficult to ensure reliable adhesion between the at least one graphene layer 2 and the frame 600.

In an embodiment, the liquid 608 has a composition which reduces surface tension or capillary effects and thereby reduces the risk of tearing or rupture. In an embodiment, the liquid 608 comprises a mixture of water, an alcohol (e.g. ethanol at a concentration of less than 50%), and a further solvent that is not alcohol (e.g. a ketone such as acetone, or acetonitrile). Preferably, the further solvent is selected such as to reduce the likelihood of, or prevent, the formation of a droplet of the liquid that completely spans the opening 606 in the frame 600, after transfer of the at least one graphene layer 2 to the frame 600 (relative to case where the liquid comprises water and alcohol, e.g. ethanol at a concentration of less than 50%, only). When the further solvent is not present and a droplet of the liquid that completely spans the opening 606 forms, breaking up of such a droplet can cause failure of the freestanding membrane 14 due to surface tension or capillary forces applied to the freestanding member 14. In an embodiment the further solvent is fully miscible with water and/or a mixture of water and alcohol (e.g. ethanol at a concentration of less than 50%). The further solvent is thereby able to form and disrupt hydrogen bonds in solution significantly. In an embodiment, the further solvent has a boiling point which is at least 10 degrees C. (optionally at least 20 degrees C., optionally at least 25 degrees C.) less than the boiling point of the liquid 608 without the further solvent. For example, in the case where the further solvent is acetone the boiling point will be about 57 degrees C., whereas the boiling point of a mixture of water and ethanol is typically in the range of 85-90 degrees C. Arranging for the boiling point of the further solvent to be significantly different in this manner promotes the formation of smaller droplets on the freestanding membrane 14. Formation of smaller droplets will cause surface tension effects to be more local and therefore less likely to cause failure of the freestanding membrane 14. A similar effect can be achieved for further solvent compositions which have a more similar boiling point to the water/ethanol mixture (e.g. a higher boiling point than acetone) but have a significantly different vapor pressure (e.g. lower than acetone). Acetonitrile is an example of such a further solvent composition.

In an embodiment, adhesion of the at least one graphene layer 2 to the frame 600 is improved by configuring the frame 600 such that at least a portion of the frame 600 in contact with the at least one graphene layer 2 (the border region 604 in the example of FIG. 70) is hydrophobic. In an embodiment, the hydrophobic portion is provided by forming at least a portion of the frame 600 from Si that has been treated to form Si—H at the surface (e.g. by immersion of the Si in an HF solution, for example a 48% HF solution).

In an embodiment, the transfer of the at least one graphene layer 2 to the frame 600 is performed while the liquid has a temperature in the range of 20-80 degrees Celsius, preferably 25-80 degrees Celsius, more preferably 25-60 degrees Celsius, more preferably 30-55 degrees Celsius, particularly 30-40 degrees Celsius or substantially at 35 degrees Celsius. It has been found that this modifies surface tension in such a way as to reduce the risk of surface tension or capillary effects causing failure of the freestanding membrane 14.

Figure 71:
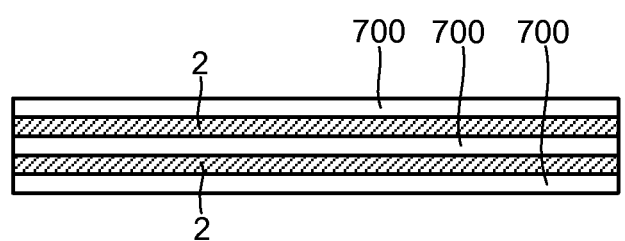
FIG. 71 depicts a freestanding membrane comprising an alternating sequence of at least one graphene layer alternating with at least one two-dimensional material other than graphene.
Figure 72:
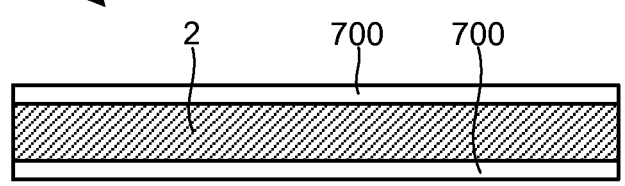
FIG. 72 depicts a freestanding membrane having capping layers each comprising at least one layer of a two-dimensional material other than graphene.
Figure 73:
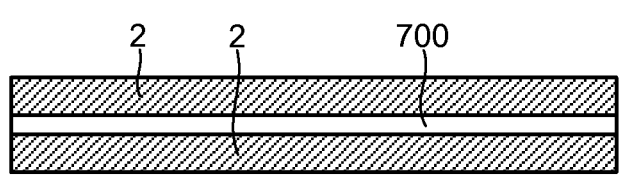
FIG. 73 depicts a freestanding membrane in which at least one layer of a two-dimensional material other than graphene is sandwiched between at least one layer of graphene on one side and at least one layer of graphene on the other side.

In an embodiment, the method of manufacturing a pellicle is adapted so that the freestanding membrane 14 comprises a sequence of layers having different chemical compositions, wherein the sequence comprises the at least one graphene layer 2 and at least one layer of a two-dimensional material other than graphene 700. Example arrangements are depicted in FIGS. 71-73.

A broad class of two-dimensional materials are available. When provided as a single layer, two-dimensional materials are sometimes referred to as 2D topological materials or single layer materials, and comprise a single layer of atoms. Layered combinations of different 2D materials are sometimes referred to as van der Waals heterostructures. Examples of 2D materials include graphene, graphyne, borophene, silicene, stanene, phosphorene, molybdenite, graphane, h-BN (hexagonal boron nitride), germanane, MXenes and transition metal dichalcogenides, including for example $MoS_2$, $MoSe_2$ and $WSe_2$. MXenes are layered transition metal carbides and carbonitrides with general formula of $M_{n+1}X_nT_x$, where M stands for early transition metal, X stands for carbon and/or nitrogen and $T_x$ stands for surface terminations (mostly =O, —OH or —F).

The incorporation into the freestanding membrane 14 of one or more layers of a two-dimensional material other than graphene can provide various benefits.

Firstly, the one or more layers of a two-dimensional material other than graphene can be used to control (e.g. reduce) etching by radicals (such as H* and OH*) during use of the pellicle in lithography. The control of etching improves pellicle reliability and performance.

Secondly, the one or more layers of two-dimensional material other than graphene can provide additional mechanical strength to the freestanding membrane 14. The additional mechanical strength improves pellicle robustness and lifetime. Phosphorene, an analog of graphene where every C atom is a P atom, can sustain tensile strain up to 30% and is chemically inert. Phosphorene is particularly well suited to being incorporated into the freestanding membrane 14 to provide additional mechanical strength to the freestanding membrane 14.

Thirdly, the one or more layers of a two-dimensional material other than graphene can improve the thermal properties of the freestanding membrane 14. The improvement may comprise reducing a heat load on the freestanding membrane 14 during use, for example by improving DUV emission characteristics. h-BN is particularly well suited to this application. h-BN has a bandgap of about 6 eV, which allows DUV emission. h-BN is also chemically inert and thermally stable up to 1500 K. Furthermore, there is a good atomic lattice match between h-BN and other two-dimensional materials (including graphene), which favors epitaxial growth of stacks including graphene starting from a two-dimensional material such as h-BN.

FIGS. 71-73 illustrate three different modes of incorporation of at least one layer of a two-dimensional material other than graphene 700 into the freestanding membrane 14.

FIG. 71 depicts an arrangement in which a sequence of layers is provided that comprises an alternating sequence of at least one graphene layer 2 alternating with at least one layer of a two-dimensional material other than graphene 700. Thus one or more layers of graphene 2 are followed by one or more layers of a different two-dimensional material 700 which are in turn followed by one or more layers of graphene 2, etc. Arrangements of this type may protect the at least one graphene layer 2 from chemical attack from radicals, provide additional mechanical strength to the freestanding membrane 14 and/or improve the thermal properties of the freestanding membrane 14.

FIG. 72 depicts an arrangement in which layers of two-dimensional material other than graphene are provided as capping layers on the outside of the freestanding membrane 14. Arrangements of this type are particularly well suited to protecting the at least one graphene layer 2 from chemical attack from radicals.

FIG. 73 depicts an arrangement in which at least one layer of a two-dimensional material other than graphene 700 is sandwiched between at least one layer of graphene 2 on one side and at least one layer of graphene 2 on the other side. Arrangements of this type are particularly well suited to providing additional mechanical strength and/or controlling etching of the freestanding membrane 14 during use.

Each of the layers in the arrangements of FIGS. 71-73 (and in other arrangements comprising graphene layers and layers of two-dimensional materials other than graphene)

can be formed in a variety of different ways, including CVD, ALD, PVD or any other deposition technique suitable for the selected material.

In any of the embodiments described herein, the at least one graphene layer 2 may be replaced with at least one layer of a two-dimensional material other than graphene. A pellicle may thereby be provided for example that comprises a freestanding membrane 14 comprising at least one layer of a two-dimensional material other than graphene, and optionally containing no graphene. The at least one layer of a two-dimensional material other than graphene comprises at least one layer of one or more of the following: graphyne, borophene, silicone, stanene, phosphorene, molybdenite, graphane, h-BN, germanane, an MXene, a transition metal dichalcogenide, $MoS_2$, $MoSe_2$, $WSe_2$.

In any of the embodiments described herein the pellicle may be attached to a frame arranged to provide additional support to the free-standing membrane. The pellicle attached to the frame form a pellicle assembly. The pellicle assembly may be permanently or releasably attached to a patterning device, such as a lithographic mask, forming thereby a mask assembly.

Embodiments of the invention are provided according to the following clauses.

1. A method of manufacturing a pellicle for a lithographic apparatus, comprising:
   depositing at least one graphene layer on a planar surface of a substrate, wherein the substrate comprises a first substrate portion and a second substrate portion; and
   removing the first substrate portion to form a freestanding membrane from the at least one graphene layer, the freestanding membrane being supported by the second substrate portion.
2. The method of clause 1, wherein the first substrate portion is surrounded by the second substrate portion when viewed in a direction perpendicular to the planar surface of the substrate.
3. The method of any preceding clause wherein the freestanding membrane is at least 80% transparent to radiation having a wavelength of 13.5 nm.
4. The method of any preceding clause wherein when viewed in a direction perpendicular to the planar surface of the substrate the freestanding membrane has a surface area of at least 1 $mm^2$.
5. The method of any preceding clause, wherein the at least one graphene layer comprises a plurality of graphene layers.
6. The method of any preceding clause, wherein the freestanding membrane comprises a portion of the at least one graphene layer and at least one additional layer on an upper surface or a lower surface of the at least one graphene layer.
7. The method of any preceding clause, wherein a stack comprising the at least one graphene layer and the substrate is coated with an encapsulation layer or sacrificial layer over at least a front and a side surface of the stack during the removing of the first substrate portion.
8. The method of any preceding clause, wherein the first substrate portion is removed by selective etching of the substrate.
9. The method of any preceding clause, wherein the at least one graphene layer is deposited using chemical vapor deposition.
10. The method of any preceding clause, wherein:
    the substrate comprises a base layer and a graphene-support layer;
    the at least one graphene layer is deposited on the graphene-support layer.
11. The method of clause 10, wherein the graphene-support layer comprises one or more of the following: Mo, Ni, Ru, Pt, Cu, Ti, V, Zr, Nb, Hf, Ta, W, Cr, silicized Mo, silicized Ni, silicized Ru, silicized Pt, silicized Cu, silicized Ti, silicized V, silicized Zr, silicized Nb, silicized Hf, silicized Ta, silicized W, silicized Cr, carbide of Mo, carbide of Ni, carbide of Ru, carbide of Pt, carbide of Cu, carbide of Ti, carbide of V, carbide of Zr, carbide of Nb, carbide of Hf, carbide of Ta, carbide of W, carbide of Cr.
12. The method of clause 10 or 11, wherein:
    a stack comprising the at least one graphene layer and the substrate comprises an encapsulation layer or sacrificial layer coated over at least a front and a side surface of the stack during the removing of the first substrate portion; and
    the graphene-support layer is formed after the encapsulation layer or sacrificial layer is formed.
13. The method of clause 12, wherein the encapsulation layer or sacrificial layer is formed using LPCVD and the graphene-support layer comprises Mo or silicized Mo.
14. The method of any of clauses 10-13, wherein the removing of the first substrate portion to form the freestanding membrane comprises a step of removing a portion of the graphene-support layer using a vapor etching process.
15. The method of any preceding clause, wherein:
    the substrate comprises a base layer and a first graphene-support layer;
    the at least one graphene layer is deposited on the first graphene-support layer; and
    a second graphene-support layer is deposited on the at least one graphene layer.
16. The method of clause 15, wherein the first graphene-support layer and the second graphene-support layer have the same composition.
17. The method of any preceding clause, wherein a control layer is provided over a portion of the at least one graphene layer outside of the freestanding membrane, when viewed in a direction perpendicular to the planar surface of the substrate, the control layer being usable to control a tension in the freestanding membrane.
18. The method of any preceding clause, wherein:
    the substrate comprises a base layer and a graphene-support layer;
    the at least one graphene layer is deposited on the graphene-support layer; and
    the method comprises the following steps in order:
      removing a first portion of the graphene-support layer without removing a portion of the at least one graphene layer that was deposited on the first portion of the graphene-support layer;
      depositing a control layer above the at least one graphene layer;
      removing a second portion of the graphene-support layer, causing weakening or removal of adhesion between the at least one graphene layer and layers which were positioned above the second portion of the graphene-support layer; and lifting off the layers which were positioned above the second portion of the graphene-support layer, thereby forming the freestanding membrane.

19. The method of clause 18, wherein the removing of either or both of the first portion of the graphene-support layer and the second portion of the graphene-support layer is performed using side etching.

20. The method of any of clauses 17-19, further comprising processing the control layer to change an internal structure of the control layer and thereby change a tension in the freestanding membrane.

21. The method of any preceding clause, wherein the pellicle is configured to protect an optical element in a lithographic apparatus.

22. The method of any preceding clause, wherein the freestanding membrane is configured to span continuously across a patterning device in a lithographic apparatus.

23. The method of any preceding clause, further comprising forming two or more conductive contact regions positioned to allow an electrical current to be driven through the freestanding membrane via the two or more conductive contact regions.

24. The method of any preceding clause, wherein a catalytically active metal which promotes the conversion of carbon to single- or multilayer graphene is provided within or in contact with the at least one graphene layer.

25. The method of clause 24, wherein the catalytically active metal comprises a transition metal.

26. The method of clause 24 or 25, wherein the catalytically active metal is provided via one or more of the following: doping of the at least one graphene layer by atoms of the catalytically active metal, formation of a layer of the catalytically active metal within the at least one graphene layer, formation of a layer of the catalytically active metal on one or both sides of the at least one graphene layer, and inclusion of nanoparticles of the catalytically active metal within the at least one graphene layer.

27. The method of any of clauses 24-26, wherein the catalytically active metal is provided by performing the depositing of the at least one graphene layer in the presence of a vapor of the catalytically active metal.

28. The method of any preceding clause, further comprising processing the substrate to deform the planar surface of the substrate after deposition of the at least one graphene layer, thereby changing a tension in the freestanding membrane.

29. The method of clause 28, wherein the processing of the substrate causes the substrate to bow inwards on the side of the substrate on which the at least one graphene layer has been deposited, thereby applying a compressive force to the at least one graphene layer, or causes the substrate to bow outwards on the side of the substrate on which the at least one graphene layer has been deposited, thereby applying a tensile force to the at least one graphene layer.

30. The method of clause 28 or 29, wherein the processing of the substrate comprises applying heating or cooling non-uniformly to the substrate.

31. The method of any preceding clause, wherein the freestanding membrane is formed with a capping layer on either or both sides of the at least one graphene layer.

32. The method of clause 31, wherein the capping layer is configured to protect the at least one graphene layer from chemical attack by radical species.

33. The method of clause 31 or 32, wherein the capping layer comprises a metal or metal oxide.

34. The method of clause 33, wherein the capping layer comprises one or more materials selected from the following group: Ru, Mo, B, $MoSi_2$, h-BN, $HfO_2$, $ZrO_2$, $Y_2O_3$, $Nb_2O_5$, $La_2O_3$, and $Al_2O_3$.

35. The method of any of clauses 31-34, wherein the capping layer is formed by atomic layer deposition.

36. The method of any of clauses 31-35, wherein an adhesion layer is provided between the capping layer and the at least one graphene layer.

37. The method of clause 36, wherein the adhesion layer comprises a material having $sp^2$-bonded carbon and hydrophilic groups.

38. The method of clause 35 or 36, wherein the adhesion layer comprises amorphous carbon.

39. The method of clause 38, wherein the amorphous carbon is partly oxidized.

40. The method of any preceding clause, wherein the freestanding membrane comprises a sequence of layers having different chemical compositions, wherein the sequence comprises the at least one graphene layer and at least one layer of a two-dimensional material other than graphene.

41. The method of clause 40, wherein the sequence of layers comprises an alternating sequence of at least one graphene layer alternating with at least one layer of a two-dimensional material other than graphene.

42. The method of clause 40 or 41, wherein the sequence of layers comprises at least one layer of a two-dimensional material other than graphene sandwiched between at least one layer of graphene on one side and at least one layer of graphene on the other side.

43. The method of any of clauses 31-39, wherein the capping layer comprises at least one layer of a two-dimensional material other than graphene.

44. The method of any of clauses 40-43, wherein the at least one layer of a two-dimensional material other than graphene comprises at least one layer of one or more of the following: graphyne, borophene, silicene, stanene, phosphorene, molybdenite, graphane, h-BN, germanane, an MXene, a transition metal dichalcogenide, $MoS_2$, $MoSe_2$, $WSe_2$.

45. A method of manufacturing a pellicle for a lithographic apparatus, comprising:
    transferring at least one graphene layer from a surface of a liquid to a frame comprising an opening, thereby forming a freestanding membrane from the at least one graphene layer, the freestanding membrane spanning the opening and being supported by the frame, wherein a portion of the frame in contact with the at least one graphene layer is hydrophobic.

46. A method of manufacturing a pellicle for a lithographic apparatus, comprising:
    transferring at least one graphene layer from a surface of a liquid to a frame comprising an opening, thereby forming a freestanding membrane from the at least one graphene layer, the freestanding membrane spanning the opening and being supported by the frame, wherein the liquid has a temperature in the range of 25-80 degrees Celsius during the transfer of the at least one graphene layer to the frame.

47. A method of manufacturing a pellicle for a lithographic apparatus, comprising:
    transferring at least one graphene layer from a surface of a liquid to a frame comprising an opening, thereby forming a freestanding membrane from the at least one graphene layer, the freestanding membrane spanning the opening and being supported by the frame, wherein the liquid comprises water, an alcohol, and a further solvent that is not an alcohol.
48. The method of clause 47, wherein the further solvent is such as to reduce the likelihood of, or prevent, formation of a droplet of the liquid that completely spans the opening in the frame, after transfer of the at least one graphene layer to the frame, relative to if the further solvent were not present in the liquid.
49. A pellicle for a lithographic apparatus, comprising at least one graphene layer forming a freestanding membrane supported by a planar surface of a portion of a substrate on which the graphene layer was grown, the planar surface being located outside of the freestanding membrane when viewed in a direction perpendicular to the planar surface.
50. The pellicle of clause 49, wherein the at least one graphene layer is a layer formed by chemical vapor deposition on the substrate.
51. The pellicle of clause 49 or 50 configured to protect an optical element in a lithographic apparatus.
52. The pellicle of any of clauses 49-51 configured to span continuously across a patterning device in a lithographic apparatus.
53. The pellicle of any of clauses 49-52, wherein the freestanding membrane comprises a capping layer on either or both sides of the at least one graphene layer.
54. The pellicle of clause 53, wherein the capping layer is configured to protect the at least one graphene layer from chemical attack by radical species.
55. The pellicle of clause 53 or 54, wherein the capping layer comprises a metal or metal oxide.
56. The pellicle of clause 55, wherein the capping layer comprises one or more materials selected from the following group: Ru, Mo, B, $MoSi_2$, h-BN, $HfO_2$, $ZrO_2$, $Y_2O_3$, $Nb_2O_5$, $La_2O_3$, and $Al_2O_3$.
57. The pellicle of any of clauses 53-56, wherein the capping layer is formed by atomic layer deposition.
58. The pellicle of any of clauses 53-57, wherein an adhesion layer is provided between the capping layer and the at least one graphene layer.
59. The pellicle of clause 58, wherein the adhesion layer comprises a material having $sp^2$-bonded carbon and hydrophilic groups.
60. The pellicle of clause 58 or 59, wherein the adhesion layer comprises amorphous carbon.
61. The pellicle of clause 60, wherein the amorphous carbon is partly oxidized.
62. The pellicle of any of clauses 49-61, wherein the freestanding membrane comprises a sequence of layers having different chemical compositions, wherein the sequence comprises the at least one graphene layer and at least one layer of a two-dimensional material other than graphene.
63. The pellicle of clause 62, wherein the sequence of layers comprises an alternating sequence of at least one graphene layer alternating with at least one layer of a two-dimensional material other than graphene.
64. The pellicle of clause 62 or 63, wherein the sequence of layers comprises at least one layer of a two-dimensional material other than graphene sandwiched between at least one layer of graphene on one side and at least one layer of graphene on the other side.
65. The pellicle of any of clauses 53-61, wherein the capping layer comprises at least one layer of a two-dimensional material other than graphene.
66. The pellicle of any of clauses 62-65, wherein the at least one layer of a two-dimensional material other than graphene comprises at least one layer of one or more of the following: graphyne, borophene, silicene, stanene, phosphorene, molybdenite, graphane, h-BN, germanane, an MXene, a transition metal dichalcogenide, $MoS_2$, $MoSe_2$, $WSe_2$.
67. A lithographic apparatus comprising:
a patterning device configured to impart a pattern to a beam of radiation; and
a pellicle manufactured by the method of any of clauses 1-48 and configured to protect the patterning device.
68. A lithographic apparatus comprising:
a patterning device configured to impart a pattern to a beam of radiation; and
the pellicle of any of clauses 49-66 configured to protect the patterning device.
69. A device manufacturing method comprising using the lithographic apparatus of clause 67 or 68 to manufacture a device using lithography.
70. A pellicle obtainable or obtained by the manufacturing method of any of clauses 1 to 48.
71. A pellicle comprising a membrane bonded to a membrane support, wherein:
the membrane comprises a graphene layer; and
the membrane is bonded to and created on the membrane support with a thin film deposition process.
72. The pellicle of clause 71, wherein the bond is an intrinsic bond between the membrane and the membrane support induced by the thin film deposition process of the membrane onto the membrane support.
73. The pellicle of clause 72, wherein the intrinsic bonding has a bonding strength such that the membrane remains bonded to the membrane support under a gravity force acting on the membrane.
74. The pellicle of any of clauses 71 to 73, wherein the thin film deposition process is a chemical vapor deposition process.
75. A device manufacturing method comprising:
using a patterning device to impart a pattern to a beam of radiation;
using a pellicle comprising at least one graphene layer forming a freestanding membrane to protect the patterning device; and
passing an electrical current through the at least one graphene layer to heat the at least one graphene layer.
76. The method of clause 75, wherein the at least one graphene layer is heated to a temperature at which conversion of carbon to single- or multilayer graphene is thermally activated.
77. The method of clause 75 or 76, wherein the at least one graphene layer is heated to above 800K.
78. The method of any of clauses 75-77, further comprising applying a flow of material comprising a source of carbon onto the pellicle.
79. An apparatus for processing a pellicle, the pellicle comprising at least one graphene layer forming a freestanding membrane, the apparatus comprising:
a current driving apparatus for driving an electrical current through the freestanding membrane to heat the freestanding membrane.
80. The apparatus of clause 79, further comprising a supply port for applying a flow of material comprising a source of carbon onto the pellicle.
81. The apparatus of clause 80, further comprising an enclosure for containing the pellicle during processing of the pellicle, wherein the supply port is configured to convey the flow of material comprising the source of carbon from the outside of the enclosure to the inside of the enclosure.
82. The apparatus of any of clauses 79-81, wherein the pellicle is obtainable or obtained by the manufacturing method of any of clauses 1 to 48.
83. A method of processing a pellicle, the pellicle comprising at least one graphene layer forming a freestanding membrane, the method comprising driving an electrical current through the freestanding membrane to heat the freestanding membrane.
84. The method of clause 83, further comprising applying a flow of material comprising a source of carbon onto the pellicle during the heating of the freestanding membrane by the electrical current.
85. The method of clause 83 or 84, wherein the pellicle is obtainable or obtained by the manufacturing method of any of clauses 1 to 48.
86. A method of processing a pellicle, the pellicle comprising at least one graphene layer forming a freestanding membrane, the method comprising using electrochemical deposition to apply carbon to the at least one graphene layer.
87. A pellicle comprising a freestanding membrane, the freestanding membrane comprising at least one layer of a two-dimensional material other than graphene.
88. A pellicle according to clause 87, wherein the freestanding membrane is supported by a planar surface of a portion of a substrate on which the freestanding membrane was grown, the planar surface being located outside of the freestanding membrane when viewed in a direction perpendicular to the planar surface.
89. A pellicle according to clause 87, wherein the freestanding membrane is bonded to a membrane support, wherein the freestanding membrane is bonded to and created on the membrane support with a thin film deposition process.
90. The pellicle of clause 87 to 89, wherein the at least one layer of a two-dimensional material other than graphene comprises at least one layer of one or more of the following: graphyne, borophene, silicene, stanene, phosphorene, molybdenite, graphane, h-BN, germanane, an MXene, a transition metal dichalcogenide, $MoS_2$, $MoSe_2$, $WSe_2$.
91. A method of manufacturing a pellicle for a lithographic apparatus, comprising:
    depositing at least one layer of a two-dimensional material on a planar surface of a substrate, wherein the substrate comprises a first substrate portion and a second substrate portion; and
    removing the first substrate portion to form a freestanding membrane from the at least one layer of a two-dimensional material, the freestanding membrane being supported by the second substrate portion.
92. A pellicle assembly suitable for use in a lithographic process, the pellicle assembly comprising:
    a pellicle according to any one of clauses 49 to 66 or 87 to 90; and
    a frame configured to support the pellicle.
93. A mask assembly suitable for use in a lithographic process, the mask assembly comprising:
    a patterning device;
    a pellicle according to any one of clauses 49 to 66 or 87 to 90; and
    a frame configured to support the pellicle.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

While specific embodiments of the invention have been described above, it will be appreciated that the invention may be practiced otherwise than as described. For example, the various lacquer layers may be replaced by non-lacquer layers that perform the same function.

The descriptions above are intended to be illustrative, not limiting. Thus it will be apparent to one skilled in the art that modifications may be made to the invention as described without departing from the scope of the claims set out below.

The invention claimed is:

1. A pellicle for a lithographic apparatus, the pellicle comprising at its core at least 10, and no more than 50, adjoining layers of graphene layers, graphene-derivative layers, or a combination of graphene and graphene-derivative layers, forming a freestanding membrane supported by a planar surface of a portion of a substrate in a frame configuration, wherein the planar surface is located outside of the freestanding membrane when viewed in a direction perpendicular to the planar surface, wherein a continuous freestanding area of the freestanding membrane is at least 10 $mm^2$, wherein the continuous freestanding area of the freestanding membrane has a maximum sag in use not exceeding 500 microns, wherein the continuous freestanding area of the freestanding membrane is at least 80% transparent to extreme ultraviolet radiation, and wherein a tension control layer to control a tension in the freestanding membrane is located along an outer edge of the freestanding membrane supported by the substrate in the frame configuration.

2. The pellicle of claim 1, wherein the freestanding membrane comprises a capping layer on either or both sides of the at least 10 adjoining layers.

3. The pellicle of claim 2, wherein the capping layer is configured to protect the at least 10 adjoining layers from chemical attack by radical species.

4. The pellicle of claim 2, wherein the capping layer comprises a metal or metal oxide.

5. The pellicle of claim 4, wherein the capping layer comprises one or more materials selected from: Ru, Mo, B, $MoSi_2$, h-BN, $HfO_2$, $ZrO_2$, $Y_2O_3$, $Nb_2O_5$, $La_2O_3$, $Al_2O_3$.

6. The pellicle of claim 2, wherein an adhesion layer is provided between the capping layer and the at least 10 adjoining layers.

7. The pellicle of claim 1, wherein the freestanding membrane comprises a sequence of layers having different chemical compositions, wherein the sequence comprises the at least 10 adjoining layers and at least one layer of a two-dimensional material other than graphene.

8. The pellicle of claim 7, wherein the at least one layer of a two-dimensional material other than graphene comprises at least one layer of one or more selected from:

graphyne, borophene, silicene, stanene, phosphorene, molybdenite, graphane, h-BN, germanane, a layered transition metal carbide and/or carbonitride, and/or a transition metal dichalcogenide.

9. The pellicle of claim 2, wherein the capping layer comprises at least one layer of a two-dimensional material other than graphene.

10. The pellicle of claim 7, wherein the portion of the substrate comprises a material comprising Mo, Ru, Pt, Ti, V, Nb, Hf, Ta, W, Fe, Co, Ni or Cu.

11. A patterning device assembly suitable for use in a lithographic process, the patterning device assembly comprising:
a patterning device configured to output patterned radiation; and
the pellicle according to claim 1.

12. A pellicle for a lithographic apparatus, the pellicle comprising at least one graphene or graphene derivative layer forming a freestanding membrane supported by a planar surface of a portion of a substrate on which the at least one graphene or graphene derivative layer was grown, the planar surface being located outside of the freestanding membrane when viewed in a direction perpendicular to the planar surface, the planar surface having a root mean squared roughness of less than 5 nm, and the planar surface comprising one or more selected from: Mo, Ru, Pt, V, Zr, Nb, Hf, Ta, W, silicized Mo, silicized Ru, silicized Pt, silicized Ti, silicized V, silicized Zr, silicized Nb, silicized Hf, silicized Ta, silicized W, silicized Cr, carbide of Mo, carbide of Ru, carbide of Pt, carbide of Ti, carbide of V, carbide of Zr, carbide of Nb, carbide of Hf, carbide of Ta, carbide of W, and/or carbide of Cr.

13. The pellicle of claim 12, wherein the freestanding membrane comprises a capping layer on either or both sides of the at least one graphene or graphene derivative layer.

14. The pellicle of claim 12, wherein the substrate has a layer on a surface that is at an angle to the planar surface.

15. The pellicle of claim 12, wherein the portion of the substrate comprises a material comprising Mo, Ru, Pt, Ti, V, Nb, Hf, Ta, W, Fe, or Co.

16. A patterning device assembly suitable for use in a lithographic process, the patterning device assembly comprising:
a patterning device configured to output patterned radiation; and
the pellicle according to claim 12.

17. A pellicle for a lithographic apparatus, the pellicle comprising at least one graphene or graphene derivative layer forming a freestanding membrane supported by a planar surface of a portion of a substrate in a frame configuration, the planar surface being located outside of the freestanding membrane when viewed in a direction perpendicular to the planar surface, and the portion of the substrate comprising a layer of material, between the substrate and the graphene or graphene derivative layer, onto which the graphene or graphene derivative layer was grown and which does not cover the freestanding membrane, the material comprising one or more selected from: Mo, Ru, Pt, V, Zr, Nb, Hf, Ta, W, silicized Mo, silicized Ru, silicized Pt, silicized Ti, silicized V, silicized Zr, silicized Nb, silicized Hf, silicized Ta, silicized W, silicized Cr, carbide of Mo, carbide of Ru, carbide of Pt, carbide of Ti, carbide of V, carbide of Zr, carbide of Nb, carbide of Hf, carbide of Ta, carbide of W, and/or carbide of Cr and wherein a tension control layer to control a tension in the freestanding membrane is located along an outer edge of the freestanding membrane supported by the substrate in the frame configuration.

18. The pellicle of claim 17, wherein the freestanding membrane comprises a capping layer on either or both sides of the at least one graphene or graphene derivative layer.

19. The pellicle of claim 17, wherein the substrate has a layer on a surface that is at an angle to the planar surface.

20. The pellicle of claim 17, further comprising a layer on the side of the at least one graphene or graphene derivative layer opposite to the side of the graphene or graphene derivative layer facing the planar surface of the portion of the substrate.

* * * * *